US011721268B2

(12) United States Patent
Lai et al.

(10) Patent No.: US 11,721,268 B2
(45) Date of Patent: Aug. 8, 2023

(54) DISPLAY PANEL AND DISPLAY DEVICE COMPRISING CASCADED SHIFT REGISTERS

(71) Applicant: Xiamen Tianma Micro-Electronics Co., Ltd., Xiamen (CN)

(72) Inventors: Qingjun Lai, Xiamen (CN); Yihua Zhu, Xiamen (CN); Yong Yuan, Xiamen (CN)

(73) Assignee: Xiamen Tianma Micro-Electronics Co., Ltd., Xiamen (CN)

(*) Notice: Subject to any disclaimer, the term of this patent is extended or adjusted under 35 U.S.C. 154(b) by 0 days.

(21) Appl. No.: 17/528,165

(22) Filed: Nov. 16, 2021

(65) Prior Publication Data

US 2022/0076611 A1    Mar. 10, 2022

(30) Foreign Application Priority Data

May 12, 2021   (CN) .......................... 202110519069.5

(51) Int. Cl.
*G09G 3/32*       (2016.01)
*G09G 3/20*       (2006.01)
*G11C 19/28*      (2006.01)
*G09G 3/3266*     (2016.01)
*G09G 3/36*       (2006.01)

(52) U.S. Cl.
CPC .............. *G09G 3/2092* (2013.01); *G09G 3/20* (2013.01); *G09G 3/3266* (2013.01); *G09G 3/3674* (2013.01); *G09G 2310/0286* (2013.01); *G09G 2310/08* (2013.01); *G11C 19/28* (2013.01)

(58) Field of Classification Search
CPC ...... G09G 3/20; G09G 3/2092; G09G 3/3266; G09G 3/3674; G09G 2310/0286; G09G 2310/08; G11C 19/28
See application file for complete search history.

(56) References Cited

U.S. PATENT DOCUMENTS

| 10,950,157 | B1* | 3/2021 | Kim ..................... G09G 3/3266 |
| 2009/0021509 | A1* | 1/2009 | Lee ..................... G09G 3/3677 |
| | | | 345/213 |
| 2019/0325800 | A1* | 10/2019 | Xiang ................. G09G 3/3266 |
| 2020/0251044 | A1* | 8/2020 | Lin ...................... G09G 3/3266 |

FOREIGN PATENT DOCUMENTS

CN        108461062 A  *  8/2018  ............... G09G 3/20

* cited by examiner

*Primary Examiner* — Adam J Snyder
(74) *Attorney, Agent, or Firm* — Kilpatrick Townsend & Stockton, LLP

(57) ABSTRACT

Provided are a display panel and a display device. The display panel includes a driver circuit including N stages of cascaded shift registers, where N≥2. Each shift register includes a first control part and a second control part. The second control part includes a first control unit and a second control unit. The first control unit is configured to receive a signal of a preset node and a first output control signal and control a signal of a fourth node, where the preset node is one of a second node or a third node. A first output control signal received by a shift register at an M1-th stage is a signal of the preset node of a shift register at an M2-th stage, where 1≤M1≤N, 1≤M2≤N, 1≤|M1−M2|≤i, and 2≤i≤N−1.

19 Claims, 18 Drawing Sheets

DISPLAY PANEL AND DISPLAY DEVICE COMPRISING CASCADED SHIFT REGISTERS

CROSS-REFERENCE TO RELATED APPLICATION

This application claims priority to Chinese Patent Application No. 202110519069.5 filed May 12, 2021, the disclosure of which is incorporated herein by reference in its entirety.

FIELD

Embodiments of the present disclosure relate to the field of display technologies and, in particular, to a display panel and a display device.

BACKGROUND

With the continuous development of display technologies, various display panels such as an organic light-emitting display panel and a liquid crystal display panel are widely used in electronic devices with display functions, bringing great convenience to people's daily life and work.

The display panel generally includes a driver circuit. The driver circuit is configured to output a drive signal, and the drive signal is transmitted to a pixel circuit in a pixel array by using a gate scanning line and other signal lines, so that the pixel array is controlled to display an image. It has become a current research focus to provide a driver circuit with a simple structure and stable output.

SUMMARY

The present disclosure provides a display panel to provide a driver circuit with a simple structure and stable output.

In a first aspect, embodiments of the present disclosure provide a display panel. The display panel includes a driver circuit including N stages of cascaded shift registers, where $N \geq 2$.

Each shift register includes a first control part and a second control part.

The first control part is configured to receive at least an input signal and control a signal of a first node and a signal of a second node in response to at least a first clock signal, and the first control part is configured to receive a second voltage signal and a first voltage signal and control a signal of a third node in response to a signal of the first node and a signal of the second node, where the first voltage signal is a low level signal, and the second voltage signal is a high level signal.

The second control part includes a first control unit and a second control unit.

The first control unit is configured to receive a signal of a preset node and a first output control signal and control a signal of a fourth node, where the preset node is one of the second node or the third node.

The second control unit is configured to receive the first voltage signal and generate an output signal in response to a signal of the fourth node, or the second control unit is configured to receive a fourth voltage signal and generate an output signal in response to a signal of a fifth node, where the fifth node is connected to one of the second node or the third node that is not the preset node, the third voltage signal is a low level signal, and the fourth voltage signal is a high level signal.

A first output control signal received by a shift register at an M1-th stage is a signal of a preset node of a shift register at an M2-th stage, where $1 \leq M1 \leq N$, $1 \leq M2 \leq N$, $1 \leq |M1-M2| \leq i$, and $2 \leq i \leq N-1$.

In a second aspect, embodiments of the present disclosure further provide a display device. The display device includes the display panel described in any of embodiments of the present disclosure.

In the display panel provided in embodiments of the present disclosure, a driver circuit includes a first control part and a second control part; the second control part includes a first control unit and a second control unit, where the first control unit is configured to control a signal of a fourth node according to a signal of a preset node and a first output control signal, and the second control unit is configured to output a first voltage signal according to a signal of the fourth node or is configured to output a fourth voltage signal according to a signal of a fifth node, where the first voltage signal and the fourth voltage signal form an output signal of the shift register. In this manner, the urgent need for a driver circuit with a simple structure and stable output in the related art can be solved, and the effect of providing a driver circuit with a simple structure and a stable output signal can be achieved.

DETAILED DESCRIPTION

Figure 1:
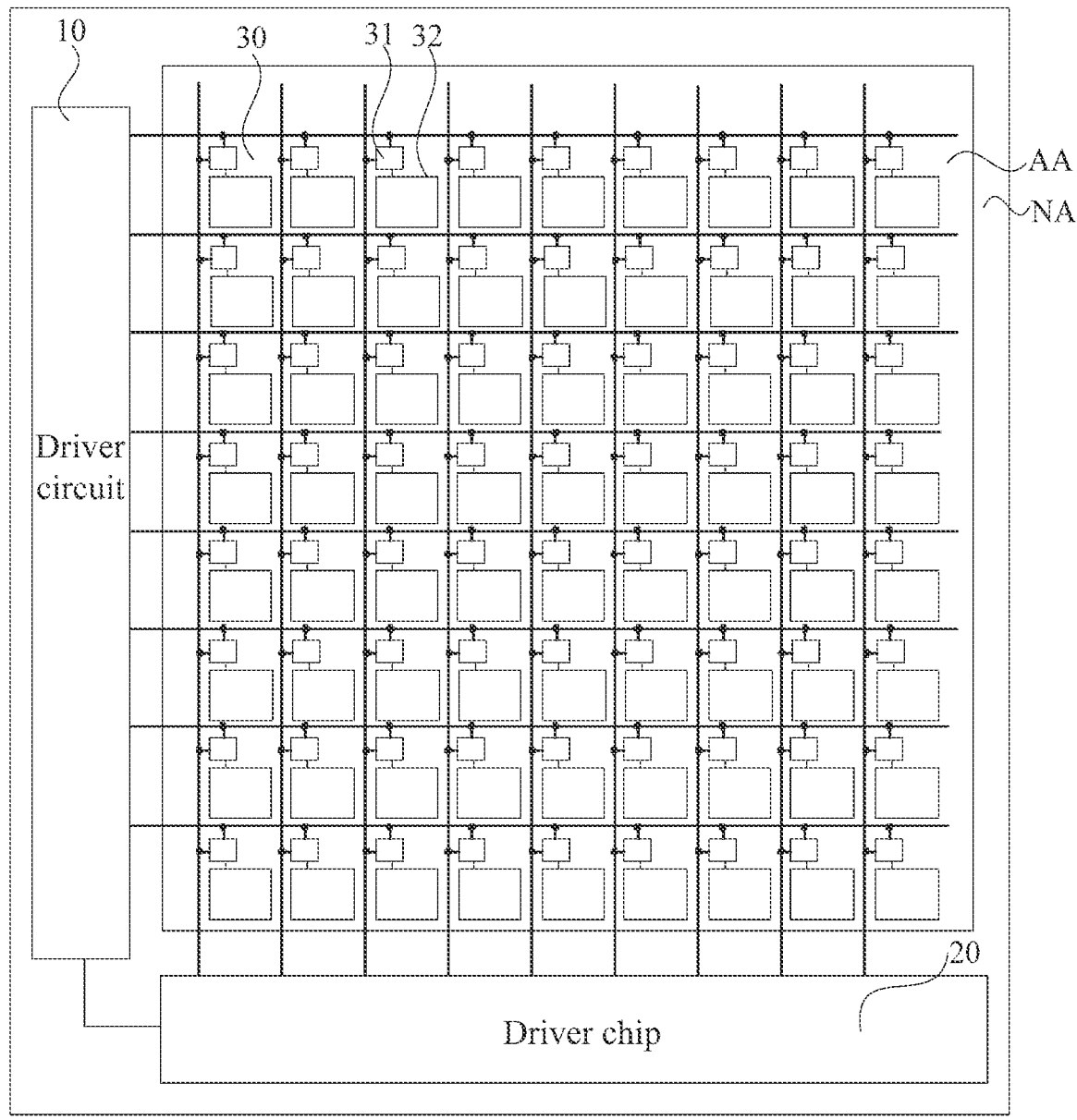
FIG. 1 is a structure diagram of a display panel according to an embodiment of the present disclosure.

The present disclosure is further described hereinafter in detail in conjunction with drawings and embodiments. It is to be understood that embodiments described hereinafter are intended to explain the present disclosure and not to limit the present disclosure. Additionally, it is to be noted that for ease of description, only part, not all, of structures related to the present disclosure are illustrated in the drawings.

In view of the problem mentioned in BACKGROUND, embodiments of the present disclosure provide a display panel and a display device. The display panel includes a driver circuit. The driver circuit includes N stages of cascaded shift registers, where N≥2. The shift register includes a first control part and a second control part. The first control part receives at least an input signal and controls a signal of a first node and a signal of a second node in response to at least a first clock signal, and the first control part receives a first voltage signal and a second voltage signal and controls a signal of a third node in response to a signal of the first node and a signal of the second node, where the first voltage signal is a low level signal, and the second voltage signal is a high level signal. The second control part includes a first control unit and a second control unit. The first control unit is configured to receive a signal of a preset node and a first output control signal and control a signal of a fourth node, where the preset node is one of the second node or the third node. The second control unit is configured to receive a third voltage signal and generate an output signal in response to a signal of the fourth node, or the second control unit is configured to receive a fourth voltage signal and generate an output signal in response to a signal of a fifth node, where the fifth node is connected to one of the second node or the third node that is not the preset node, the third voltage signal is a low level signal, and the fourth voltage signal is a high level signal. A first output control signal received by a shift register at an M1-th stage is a signal of a present node of a shifter register at an M2-th stage, where 1≤M1≤N, 1≤M2≤N, 1≤|M1−M2|≤i, and 2≤i≤N−1. By adopting the preceding embodiments, a driver circuit with a simple structure and stable output can be obtained.

In embodiments of the present disclosure are described clearly and completely below in conjunction with the drawings in embodiments of the present disclosure. Apparently, the embodiments described below are part, not all, of embodiments of the present disclosure.

Figure 2:
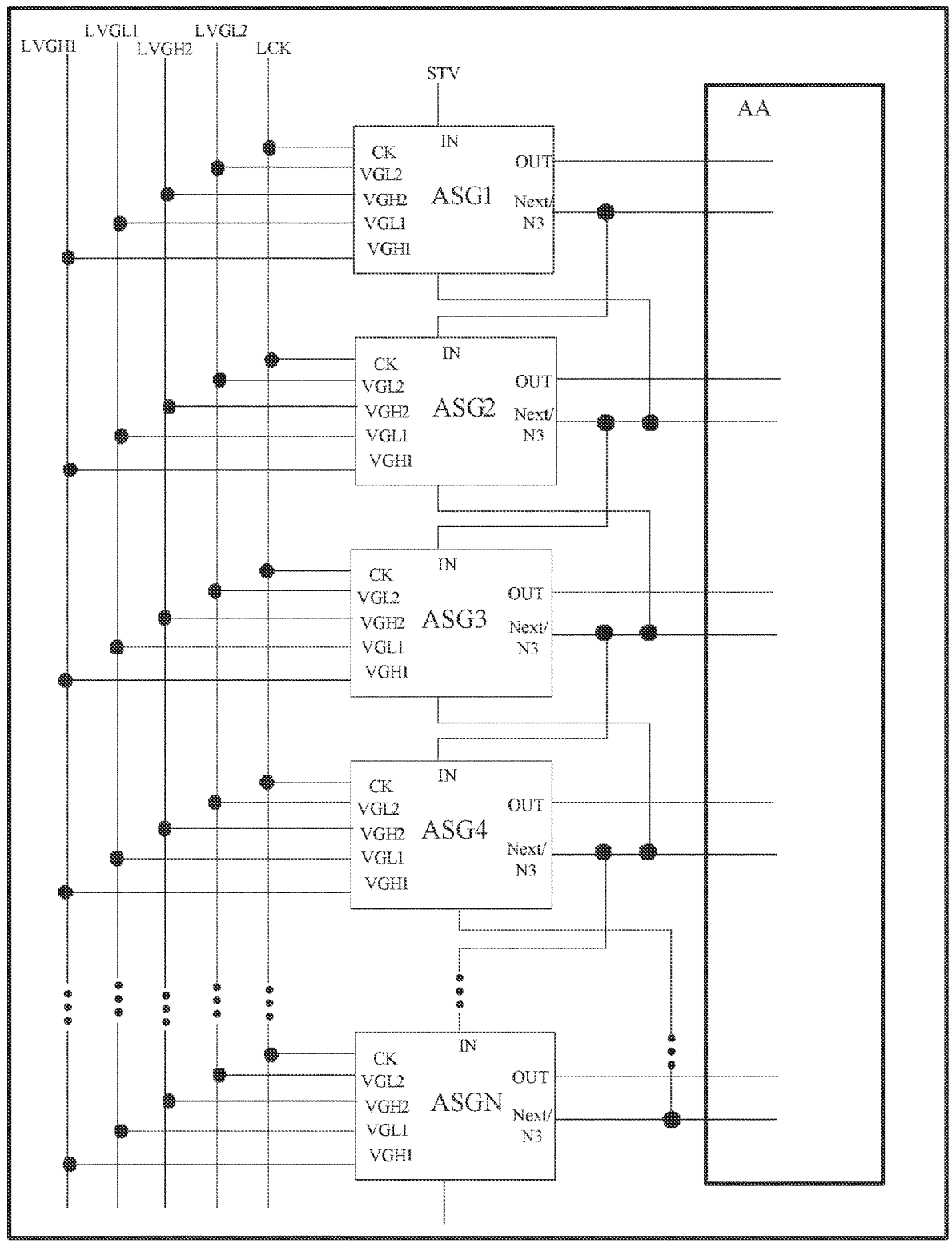
FIG. 2 is a structure diagram of a driver circuit according to an embodiment of the present disclosure.
Figure 3:
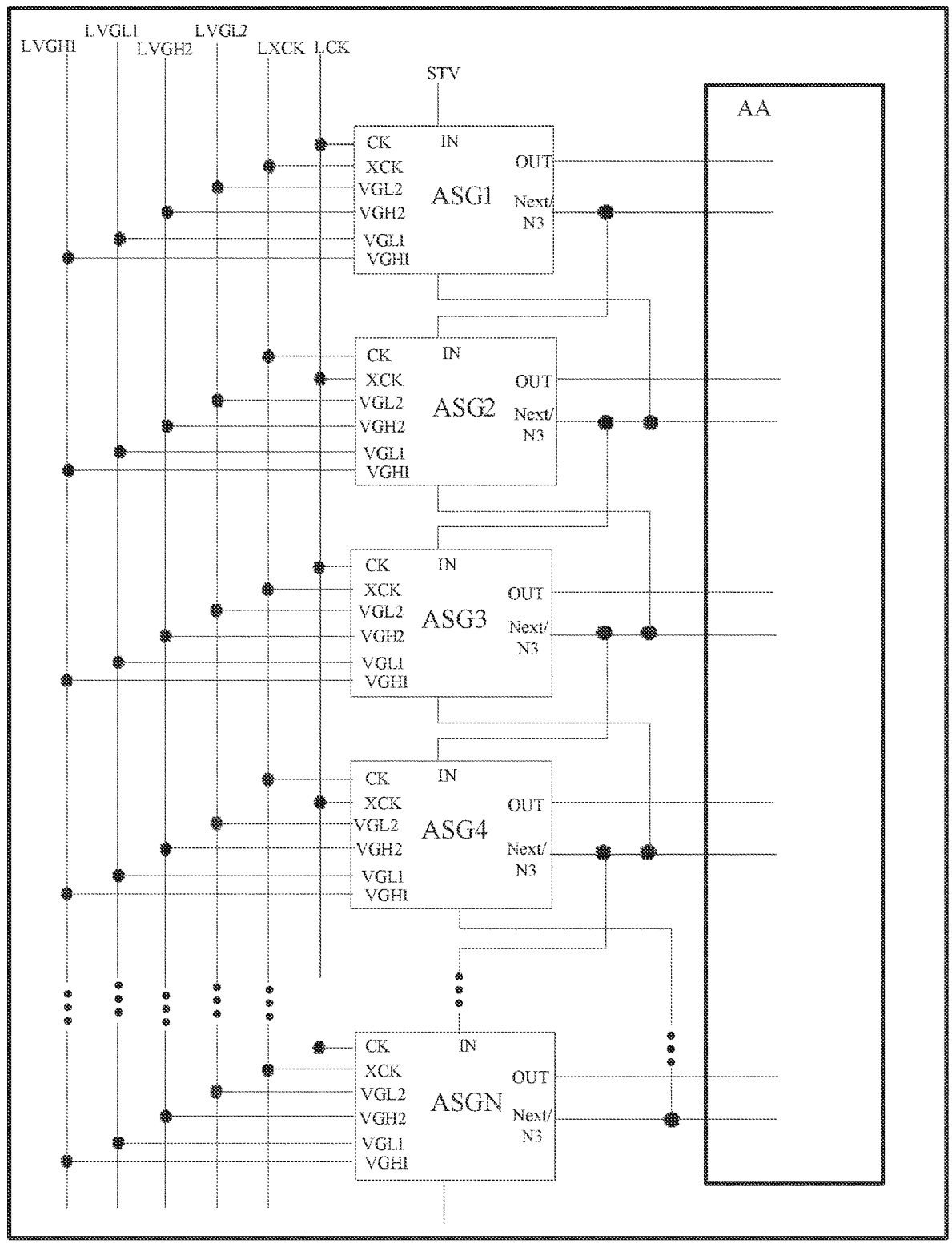
FIG. 3 is a structure diagram of another driver circuit according to an embodiment of the present disclosure.
Figure 4:
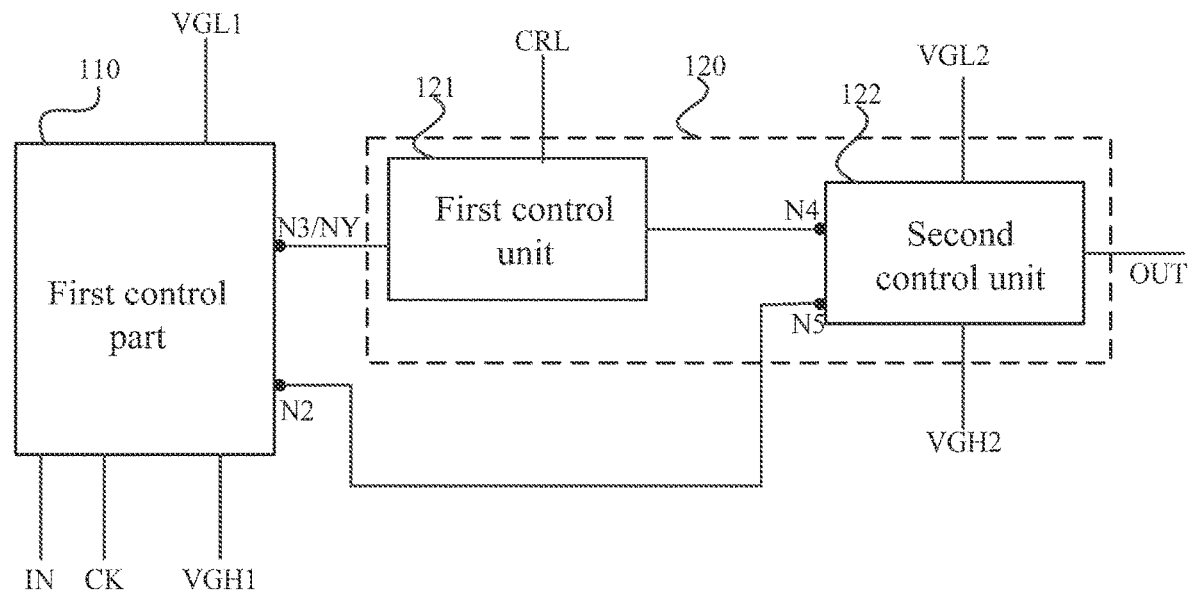
FIG. 4 is a structure diagram of a shift register according to an embodiment of the present disclosure.
Figure 5:
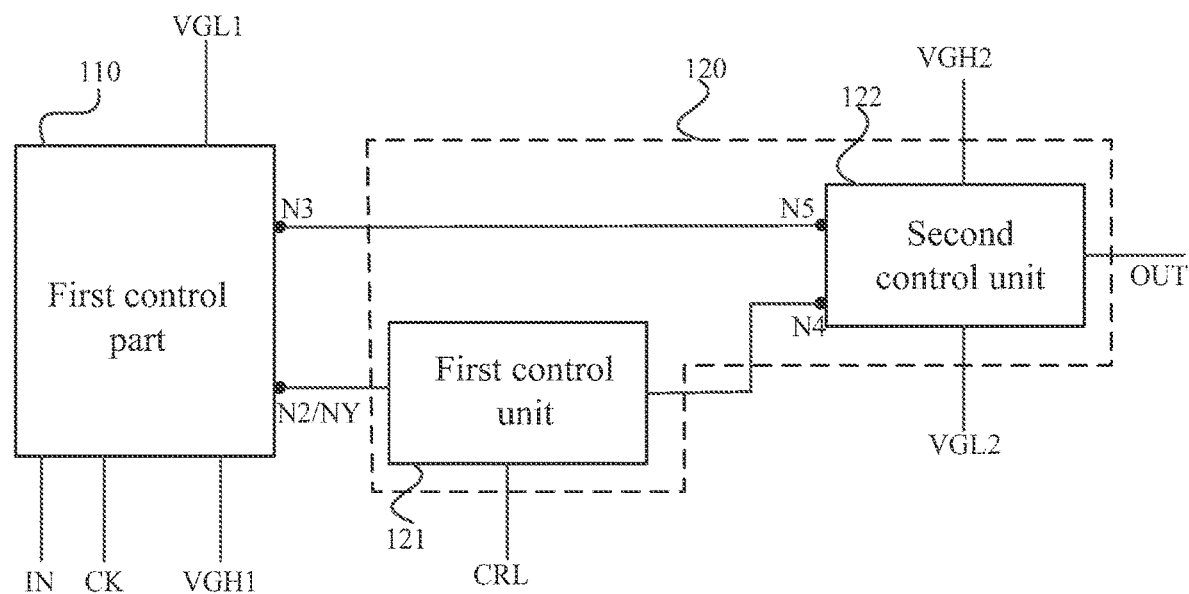
FIG. 5 is a structure diagram of another shift register according to an embodiment of the present disclosure.
Figure 6:
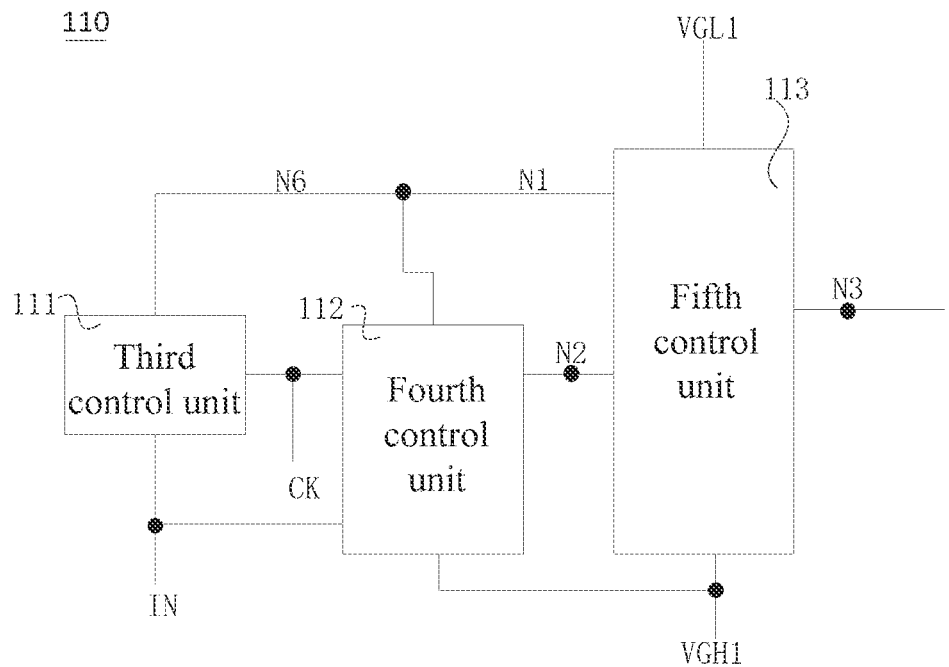
FIG. 6 is a structure diagram of a first control part according to an embodiment of the present disclosure.
Figure 7:
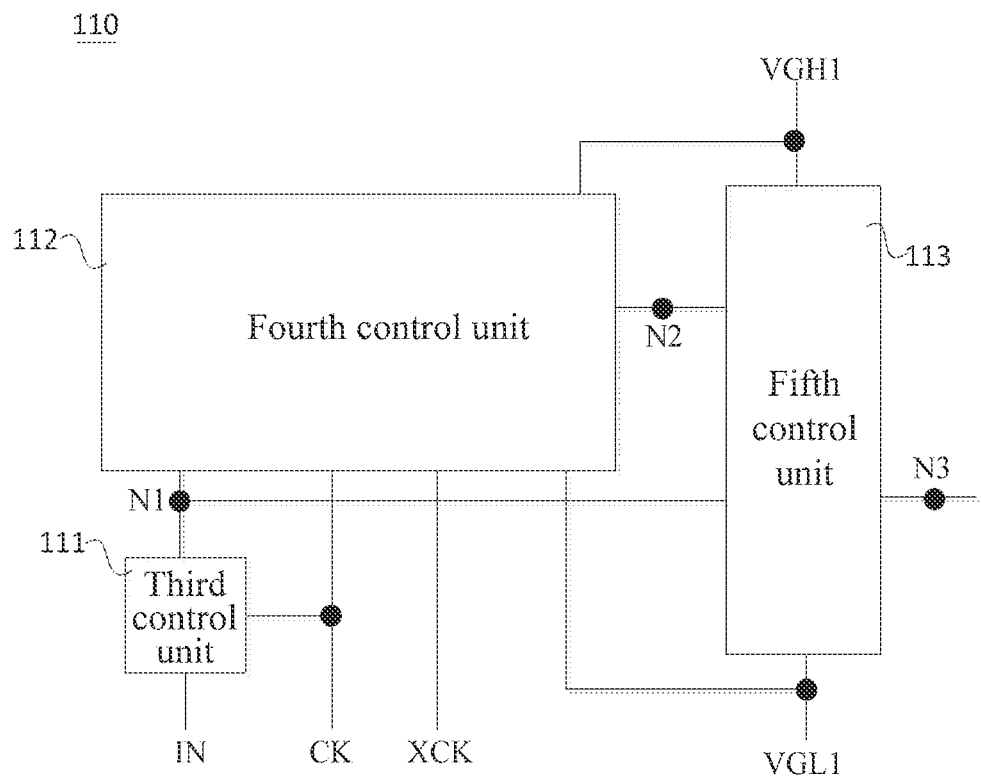
FIG. 7 is a structure diagram of another first control part according to an embodiment of the present disclosure.

FIG. 1 is a structure diagram of a display panel according to an embodiment of the present disclosure. FIG. 2 is a structure diagram of a driver circuit according to an embodiment of the present disclosure. FIG. 3 is a structure diagram of another driver circuit according to an embodiment of the present disclosure. FIG. 4 is a structure diagram of a shift register according to an embodiment of the present disclosure. FIG. 5 is a structure diagram of another shift register according to an embodiment of the present disclosure. FIG. 6 is a structure diagram of a first control part according to an embodiment of the present disclosure. FIG. 7 is a structure diagram of another first control part according to an embodiment of the present disclosure. The structure of the shift register in the driver circuit shown in FIG. 2 is different from the structure of the shift register in the driver circuit shown in FIG. 3, the preset node in the shift register shown in FIG. 4 is different from the preset node in the shift register shown in FIG. 5, and the structure of the first control part shown in FIG. 6 is different from the structure of the first control part shown in FIG. 7. Referring to FIGS. 1 to 7, the display panel includes a driver circuit 10. The driver circuit 10 includes N stages of cascaded shift registers, where N≥2. The shift register includes a first control part 110 and a second control part 120. The first control part 110 receives at least an input signal IN and controls a signal of a first node N1 and a signal of a second node N2 in response to at least a first clock signal, and the first control part 110 receives a first voltage signal VGL1 and a second voltage signal VGH1 and controls a signal of a third node N3 in response to a signal of the first node N1 and a signal of the second node N2, where the first voltage signal VGL1 is a low level signal, and the second voltage signal VGH1 is a high level signal. The second control part 120 includes a first control unit 121 and a second control unit 122. The first control unit 121 is configured to receive a signal of a preset node NY and a first output control signal CRL and control a signal of a fourth node N4, where the preset node NY is one of the second node N2 or the third node N3. The second control unit 122 is configured to receive a third voltage signal VGL2 and generate an output signal OUT in response to a signal of the fourth node N4, or the second control unit 122 is configured to receive a fourth voltage signal VGH2 and generate an output signal OUT in response to a signal of a fifth node N5, where the fifth node N5 is connected to one of the second node N2 or the third node N3 that is not the preset node NY, where the third voltage signal VGL2 is a low level signal, and the fourth voltage signal VGH2 is a high level signal. A first output control signal CRL received by a shift register at an M1-th stage is a signal of a present node NY of a shifter register at an M2-th stage, where 1≤M1≤N, 1≤M2≤N, 1≤|M1−M2|≤i, and 2≤i≤N−1.

In an embodiment, the display panel may include a display region AA and a non-display region NA. The display region AA includes multiple pixels 30, and each pixel 30 includes a pixel circuit 31 and a light-emitting element 32. The non-display region NA includes the driver circuit 10, and the driver circuit 10 is electrically connected to the pixel circuit 31 through a signal line and provides a driver signal for the pixel circuit 31 so that the pixel circuit 31 drives the light-emitting element 32 to emit light, and thus the effect of displaying an image can be achieved. The non-display region NA may further include a driver chip 20, and the drive chip 20 is electrically connected to the driver circuit 10 through a signal line and provides a signal required for the normal operation of the driver circuit 10 for the driver circuit 10, such as an input signal IN, a first clock signal, a first output control signal CRL, a first voltage signal VGL1, a second voltage signal VGH1, a third voltage signal VGL2, and a fourth voltage signal VGH2.

It is to be noted that FIG. 1 only shows that the driver circuit 10 is located on the left side of the display region AA by way of example, but it is not limited to this. Some embodiment may set the position of the driver circuit 10 in the display panel according to actual situations. For example, driver circuits 10 may also be disposed on two opposite sides of the display region AA.

In an embodiment, the driver circuit 10 includes N stages of cascaded shift registers, where N≥2, and the specific value of N may be set according to actual situations and is not limited herein. The "cascaded" described herein means that a signal of a certain node of the shift register at this stage is used as an input signal IN of the shift register at the next stage. For the shift register at the first stage, the input signal IN may be provided by the driver chip 20.

In an embodiment, the specific structure of the first control part 110 may be set according to actual situations and is not limited herein, and typical examples will also be described hereinafter, which will not be repeated herein. Although the specific structure of the first control part 110 is various, the first control part 110 in any structure needs at least one input signal IN and at least one first clock signal as shown in FIGS. 6 and 7. The input signal IN includes a high level signal and a low level signal. For example, the input signal IN may be equal to the voltage value of the first voltage signal VGL1 or the voltage value of the second voltage signal VGH1. The first clock signal also includes a high level signal and a low level signal. For example, the first clock signal may be equal to the voltage value of the first voltage signal VGL1 or the voltage value of the second voltage signal VGH1. The state of the first clock signal at a certain moment (whether at a high level or a low level) determines the state of the first node N1 and the state of the second node N2 at this moment, that is, the level change of the first clock signal may cause the level change of the first node N1 and the level change of the second node N2. The state of the signal of the first node N1 and the state of the signal of the second node N2 at a certain moment together determine the state of the signal of the third node N3 at this moment, that is, the level change of the first node N1 and the level change of the second node N2 may cause the level change of the third node N3.

In an embodiment, a drive signal (that is, the output signal OUT) output by the shift register includes a high level signal (that is, the fourth voltage signal VGH2) and a low level signal (that is, the third voltage signal VGL2). The drive signal may be valid when the drive signal is a high level signal or may be valid when the drive signal is a low level signal, which is not limited herein. When the drive signal is a valid level signal, a pixel circuit 31 that receives the drive signal starts to operate in response to the valid level signal and drives a light-emitting element 32 to emit light. The first clock signal includes a high level signal pulse and a low level signal pulse.

In an embodiment, the second control part 120 includes a first control unit 121 and a second control unit 122. The first control unit 121 is configured to receive the signal of the preset node NY and the first output control signal CRL and control the signal of the fourth node N4. The preset node NY may be the third node N3; and in this case, the second node N2 is electrically connected to the fifth node N5 (as shown in FIG. 4). The preset node NY may also be the second node N2; and in this case, the third node N3 is electrically connected to the fifth node N5 (as shown in FIG. 5). The second control unit 122 is configured to control the output of the third voltage signal VGL2 in response to the signal of the fourth node N4, or control the output of the fourth voltage signal VGH2 in response to the signal of the fifth node N5, and the third voltage signal VGL2 and the fourth voltage signal VGH2 form the output signal OUT of the shift register.

The first output control signal CRL received by the shift register at the M1-th stage may be the signal of the preset node NY of the shift register at another stage. In this manner, the driver chip 20 does not need to output the first output control signal CRL to the shift register, and thus a circuit structure for generating the first output control signal CRL does not need to be provided in the driver chip 20, which is conducive to reducing the cost of the driver chip 20; moreover, a signal line for transmitting the first output control signal CRL does not need to be provided on the display panel, which is conducive to reducing the frame and increasing the screen-to-body ratio.

It is to be noted that the value range of the voltage value of the high level signal and the value range of the voltage value of the low level signal may be set according to actual situations, which are not limited herein. The first voltage signal and the third voltage signal are both low level signals, and the voltage value of the first voltage signal may be the same as or different from the voltage value of the third voltage signal, which is not limited herein. The second voltage signal and the fourth voltage signal are both high level signals, and the voltage value of the second voltage signal may be the same as or different from the voltage value of the fourth voltage signal, which is not limited herein. In an embodiment, the voltage value of the first voltage signal is less than the voltage value of the third voltage signal, and the voltage value of the second voltage signal is greater than the voltage value of the fourth voltage signal. In this manner, the waveform stability of the output signal OUT of the shift register can be improved.

In the display panel provided in embodiments of the present disclosure, a driver circuit 10 includes a first control part 110 and a second control part 120; and the second control part 120 includes a first control unit 121 and a second control unit 122, where the first control unit 121 is configured to control a signal of a fourth node N4 according to a signal of a preset node NY and a first output control signal CRL, and the second control unit is configured to output a third voltage signal VGL2 according to the signal of the fourth node N4 or is configured to output a fourth voltage signal VGH2 according to a signal of a fifth node N5, where the third voltage signal VGL2 and the fourth voltage signal VGH2 form an output signal OUT of the shift register. In this manner, the urgent need for the driver circuit 10 with a simple structure and stable output in the related art can be solved, and the effect of providing the driver circuit 10 with a simple structure and a stable output signal OUT can be achieved.

In an embodiment, during at least part of the time period during which the signal of the fourth node N4 is a low level signal, the signal of the preset node NY and the first output control signal CRL are both low level signals.

Figure 8:
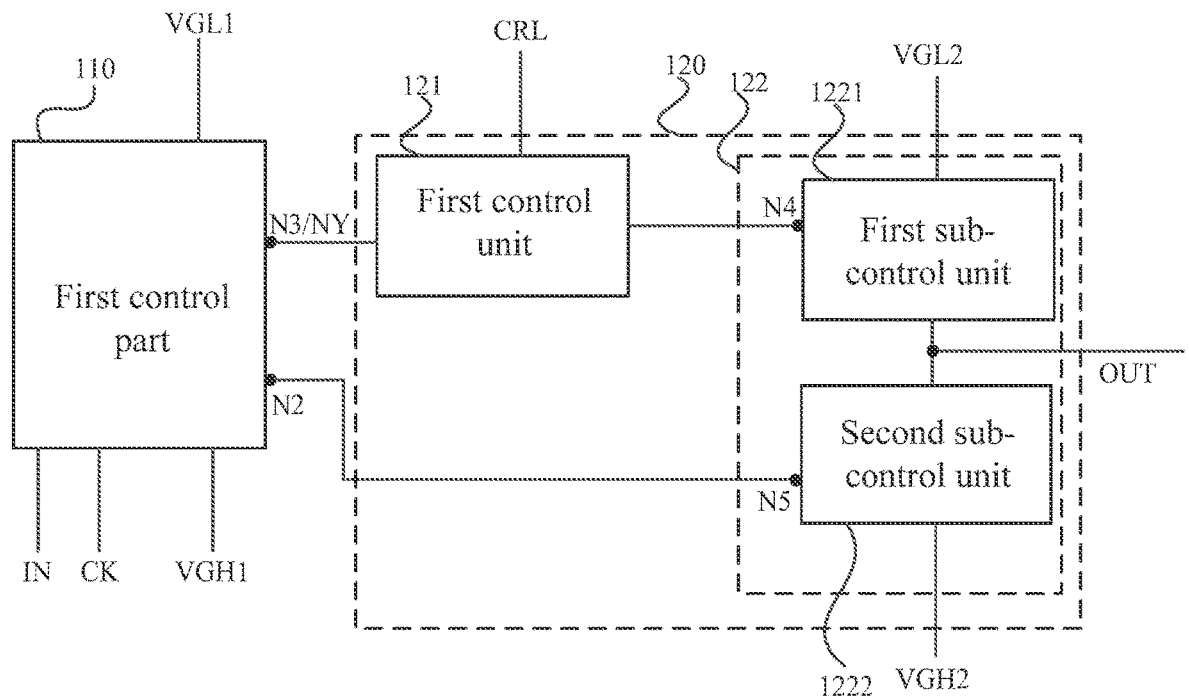
FIG. 8 is a structure diagram of another shift register according to an embodiment of the present disclosure.
Figure 9:
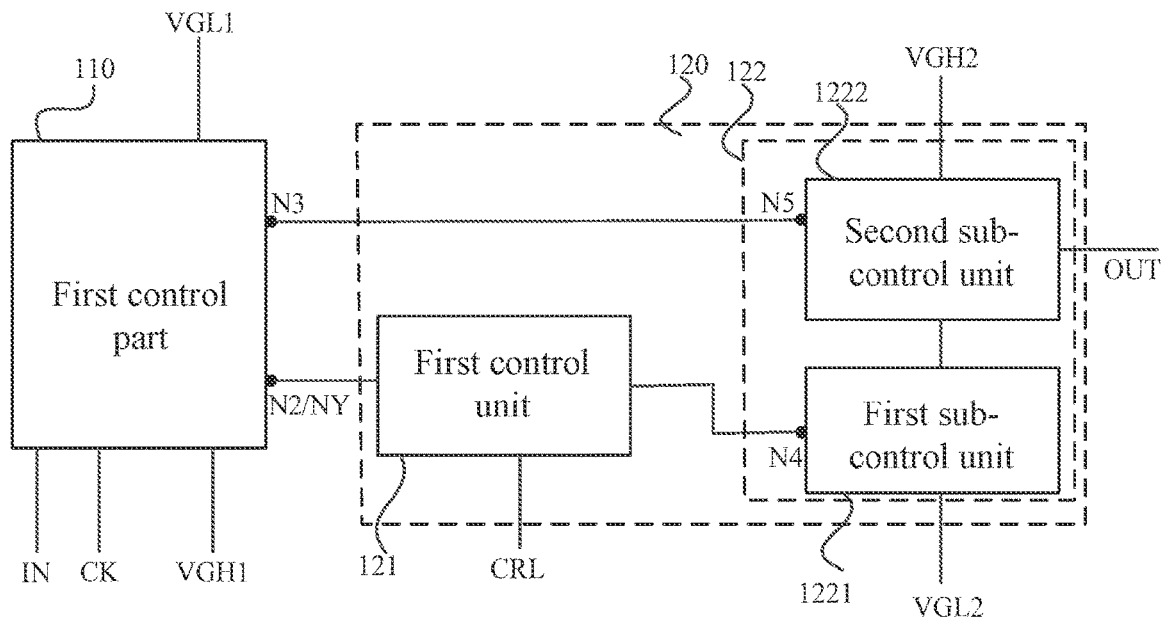
FIG. 9 is a structure diagram of another shift register according to an embodiment of the present disclosure.

The preset node NY described herein refers to the second node N2 (as shown in FIGS. 5 and 9) or the third node N3 (as shown in FIGS. 4 and 8) in the shift register at the same stage as the fourth node N4.

FIG. 8 is a structure diagram of another shift register according to an embodiment of the present disclosure. FIG. 9 is a structure diagram of another shift register according to an embodiment of the present disclosure. The preset node NY of the shift register shown in FIG. 8 is different from the preset node NY of the shift register shown in FIG. 9. Referring to FIGS. 8 and 9, in an embodiment, the second control unit 122 includes a first sub-control unit 1221 and a second sub-control unit 1222. The first sub-control unit 1221 is configured to receive the third voltage signal VGL2 and control the output of the third voltage signal VGL2 in response to the signal of the fourth node N4, and the second sub-control unit 1222 is configured to receive the second voltage signal VGH1 and control the output of the fourth voltage signal VGH2 in response to the signal of the fifth node N5. In an embodiment, when the signal of the preset node NY is a low level signal, the signal of the fourth node N4 is also a low level signal. In addition, when the signal of the fourth node N4 is a low level signal, the first sub-control unit 1221 is turned on, and the third voltage signal VGL2 is output through the turned-on first sub-control unit 1221.

It is to be understood that the first sub-control unit 1221 is turned on when the signal of the fourth node N4 is a low level signal, and the third voltage signal VGL2 received by the first sub-control unit 1221 is also a low level signal, then the output state of the first sub-control unit 1221 is easily affected. In the present application, during at least part of the time period during which the signal of the fourth node N4 is a low level signal, the first output control signal CRL is a low level signal, so that during the time period during which the signal of the fourth node N4 is a low level signal, the first output control signal CRL has a transition from a high level signal to a low level signal, the signal of the fourth node N4 may transit from a low level signal to a low level signal with a lower voltage value, and the difference between the low voltage signal with a lower voltage value and the third voltage signal VGL2 is relatively great. In this manner, it is ensured that the first sub-control unit 1221 is fully turned on, the output state of the first sub-control unit 1221 can be prevented from being affected, and the waveform stability of the output signal OUT can be improved.

In an embodiment, a pulse period of the first clock signal is S1, and the width of a low level pulse of the output signal OUT is S2, where S2=a×S1, and i≤2a.

It is to be understood that the pulse period of the first clock signal is S1, and the width of the low level pulse of the output signal OUT is S2, where S2=a×S1, so that after the first clock signal transits for a periods, the output signal OUT passes through one low level width. For the shift register, the first clock signal passes through one pulse period, and the output signal OUT is shifted once toward the next stage or is shifted twice toward the next stage and the stage next to the next stage, that is, a difference between the start time when the shift register at this stage outputs a low level signal and the start time when the shift register at the next stage outputs a low level signal is S1 which is one pulse period of the first clock signal or S1×1/2 which is half of the pulse period of the first clock signal. This case will be described in detail later in conjunction with specific circuit timing sequence. During the stage where the output signal OUT of the shift register is a low level signal, the preset node NY and the fourth node N4 of the shift register at this stage are also low level signals. Therefore, during the stage where the output signal OUT of the shift register at the M1-th stage is a low level signal, stages where output signals OUT and signals of preset nodes NY of the shift registers from the (M1+1)-th stage to the (M1+2a−1)-th stage are low level signals also exist. In other words, the low level signal of the output signal OUT of the shift register at the M1-th stage and the low level signal of the preset node NY of the shift registers at any one of the (M1+1)-th stage to the (M1+2a−1)-th stage overlap, and thus the preset node NY of the shift register at any one of the (M1+1)-th stage to the (M1+2a−1)-th stage may be used as the first output control signal CRL of the shift register at the M1-th stage.

It is to be noted that the specific value of a may be set according to actual situations and is not limited herein.

In an embodiment, the effective pulse time of the first clock signal received by the shift register at the M1-th stage and the effective pulse time of the first clock signal received by the shift register at the (M1+1)-th stage do not overlap.

In an embodiment, some first control parts 110 need the first clock signal to control the signal changes of the first node N1, the second node N2, and the third node N3 (as shown in FIG. 6). In this case, if a first clock signal input terminal of the shift register at the M1-th stage is connected to a CK signal, a first clock signal input terminal of the shift register at the (M1+1)-th stage is connected to an XCK signal. Some first control parts 110 need both the first clock signal and a second clock signal to control the signal changes of the first node N1, the second node N2, and the third node N3 (as shown in FIG. 7). In this case, if the first clock signal input terminal of the shift register at the M1-th stage is connected to the CK signal, and a second clock signal input terminal is connected to the XCK signal, then the first clock signal input terminal of the shift register at the (M1+1)-th stage is connected to the XCK signal, and a second clock signal input terminal is connected to the CK signal. The effective pulse time of the first clock signal received by the shift register at the M1-th stage and the effective pulse time of the first clock signal received by the shift register at the (M1+1)-th stage do not overlap, so that it can be ensured that the pulse signal time of the XCK signal received by the first clock signal terminal of the shift register at the (M1+1)-th stage and the pulse signal time of the CK signal received by the first clock signal terminal of the shift register at the M1-th stage do not overlap, and thus the shift effect of the output signal OUT can be ensured.

In an embodiment, the specific structure of the first control unit 121 is various, and typical examples are described hereinafter and do not constitute a limitation to the present application.

Figure 10:
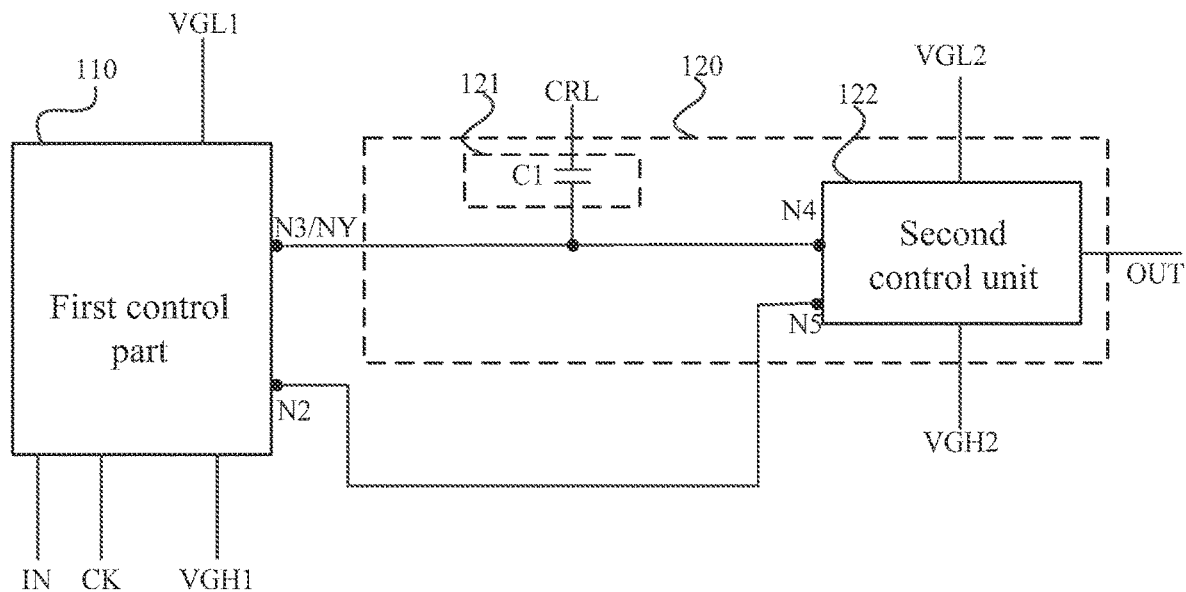
FIG. 10 is a structure diagram of a shift register according to an embodiment of the present disclosure.
Figure 11:
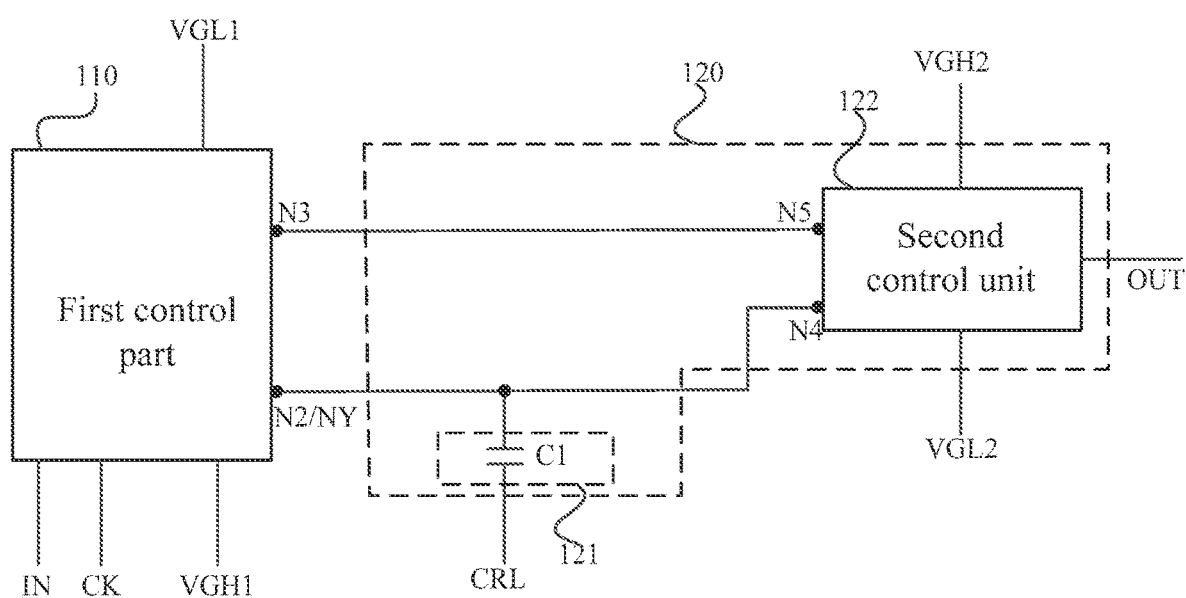
FIG. 11 is a structure diagram of another shift register according to an embodiment of the present disclosure.

FIG. 10 is a structure diagram of a shift register according to an embodiment of the present disclosure. FIG. 11 is a structure diagram of another shift register according to an embodiment of the present disclosure. The preset node NY of the shift register shown in FIG. 10 is different from the preset node NY of the shift register shown in FIG. 11. Referring to FIGS. 10 and 11, in an embodiment, the first control unit 121 includes a first capacitor C1, where a first electrode plate of the first capacitor C1 is configured to receive the first output control signal CRL, and a second electrode plate of the first capacitor C1 is connected to the fourth node N4.

It is to be understood that the first capacitor C1 is connected between the first output control signal CRL and the fourth node N4, and the control of the first output control signal CRL to the fourth node N4 can be achieved through the coupling effect of the first capacitor C1. During the time period during which the fourth node N4 is at a low level, the first output control signal CRL transits from a high level signal to a low level signal at a certain moment, so that the voltage value of the low level signal of the fourth node N4 becomes lower. In this manner, the difference between the low level signal of the fourth node N4 and the third voltage signal VGL2 can be increased, to enable the third voltage signal VGL2 to be output more fully and avoiding the tailing of the output signal OUT.

It is to be noted that the specific value of the capacitance of the first capacitor C1 may be set according to actual situations and is not limited herein.

Figure 12:
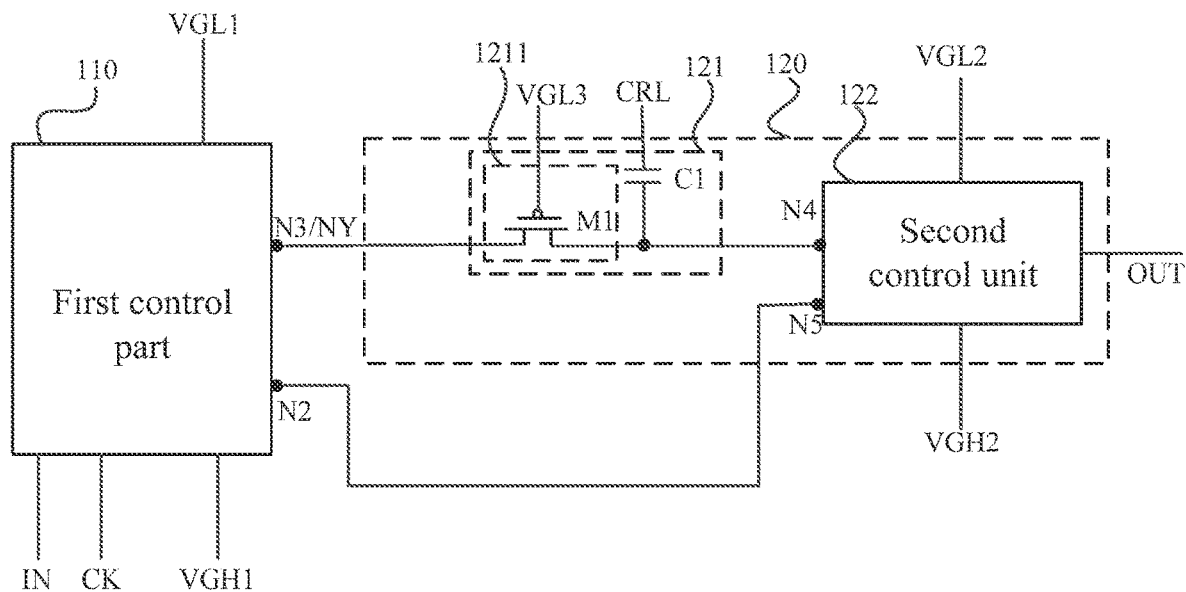
FIG. 12 is a structure diagram of another shift register according to an embodiment of the present disclosure.
Figure 13:
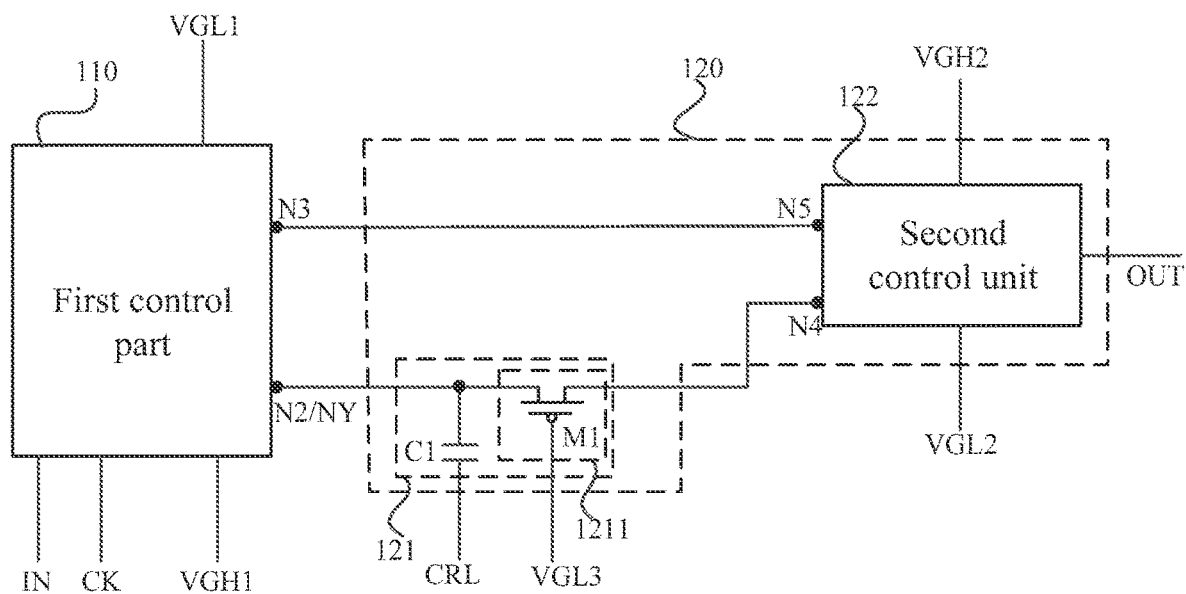
FIG. 13 is a structure diagram of another shift register according to an embodiment of the present disclosure.

FIG. 12 is a structure diagram of another shift register according to an embodiment of the present disclosure. FIG. 13 is a structure diagram of another shift register according to an embodiment of the present disclosure. The preset node NY of the shift register shown in FIG. 12 is different from the preset node NY of the shift register shown in FIG. 13. Referring to FIGS. 12 and 13, in an embodiment, the first control unit 121 further includes a first gating unit 1211. One terminal of the first gating unit 1211 is connected to the preset node NY, another terminal of the first gating unit 1211 is connected to the fourth node N4, and a control terminal of the first gating unit 1211 is configured to receive a fifth voltage signal VGL3. When the signal of the preset node NY and the first output control signal CRL are both low level signals, the fifth voltage signal VGL3 controls the first gating unit 1211 to be turned off.

It is to be understood that when the signal of the preset node NY and the first output control signal CRL are both low level signals, the first output control signal CRL acts on the fourth node N4, and the low level signal of the fourth node N4 is pulled down. In this case, the fifth voltage signal VGL3 controls the first gating unit 1211 to be turned off, which can prevent the change of the voltage value of the fourth node N4 from affecting the change of the voltage value of the preset node NY.

It is also to be understood that when the third node N3 is used as the input of the shift register at the next stage and the third node N3 is the preset node NY, the first gating unit 1211 may disconnect the third node N3 and the fourth node N4 when the first output control signal CRL acts on the fourth node N4. In this manner, the change of the voltage value of the fourth node N4 is not transmitted to the shift register at the next stage through the third node N3 so that the output of the shift register at the next stage can be prevented from being affected.

With continued reference to FIGS. 12 and 13, in an embodiment, the first gating unit 1211 includes a first transistor M1, where a source of the first transistor M1 is connected to the preset node NY, a drain of the first transistor M1 is connected to the fourth node N4, and a gate of the first transistor M1 receives the fifth voltage signal VGL3. When the signal of the preset node NY and the first output control signal CRL are both low level signals, the fifth voltage signal VGL3 controls the first transistor M1 to be turned off.

It is to be understood that the first gating unit 1211 includes the first transistor M1 so that the structure of the first gating unit 1211 can be simplified, which is conducive to simplifying the structure of the shift register.

With continued reference to FIGS. 12 and 13, in an embodiment, the first transistor M1 is a P-type metal oxide semiconductor (PMOS) type transistor, the fifth voltage signal VGL3 is a constant low level signal V, and $|V| \leq |VGL1| + |Vth|$, where VGL1 denotes the first voltage signal VGL1, and Vth denotes a threshold voltage of the first transistor M1.

It is to be understood that the fifth voltage signal VGL3 is a constant low level signal and needs to satisfy: $|V| \leq |VGL1| + |Vth|$. Since when $|V|$ is greater ($|V| > |VGL1| + |Vth|$), it means that the signal V is lower, then after the potential of the fourth node N4 is pulled down by the first output control signal CRL, the first transistor M1 cannot be turned off in this case, and it cannot be ensured that the preset node NY is disconnected from the fourth node N4. Therefore, V needs to satisfy: $|V| \leq |VGL1| + |Vth|$, so that it is ensured that the first transistor M1 can be turned off after the first output control signal CRL pulls down the fourth node N4.

In an embodiment, the fifth voltage signal VGL3 and the first voltage signal VGL1 are the same signal.

It is to be understood that the fifth voltage signal VGL3 and the first voltage signal VGL1 are the same signal so that the circuit structure only for generating the fifth voltage signal VGL3 in the driver chip 20 can be omitted, which is conducive to reducing the cost. In addition, the signal line for transmitting the fifth voltage signal VGL3 between the driver chip 20 and the driver circuit 10 can also be omitted, which is conducive to narrowing the frame.

Figure 14:
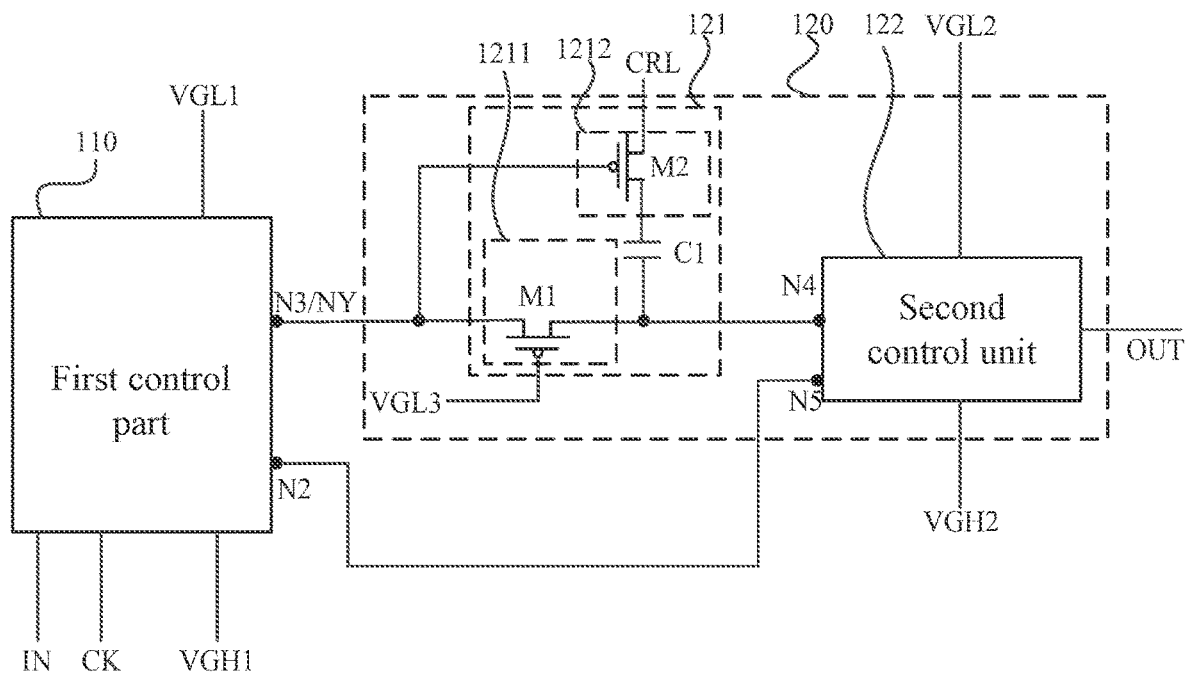
FIG. 14 is a structure diagram of a shift register according to an embodiment of the present disclosure.
Figure 15:
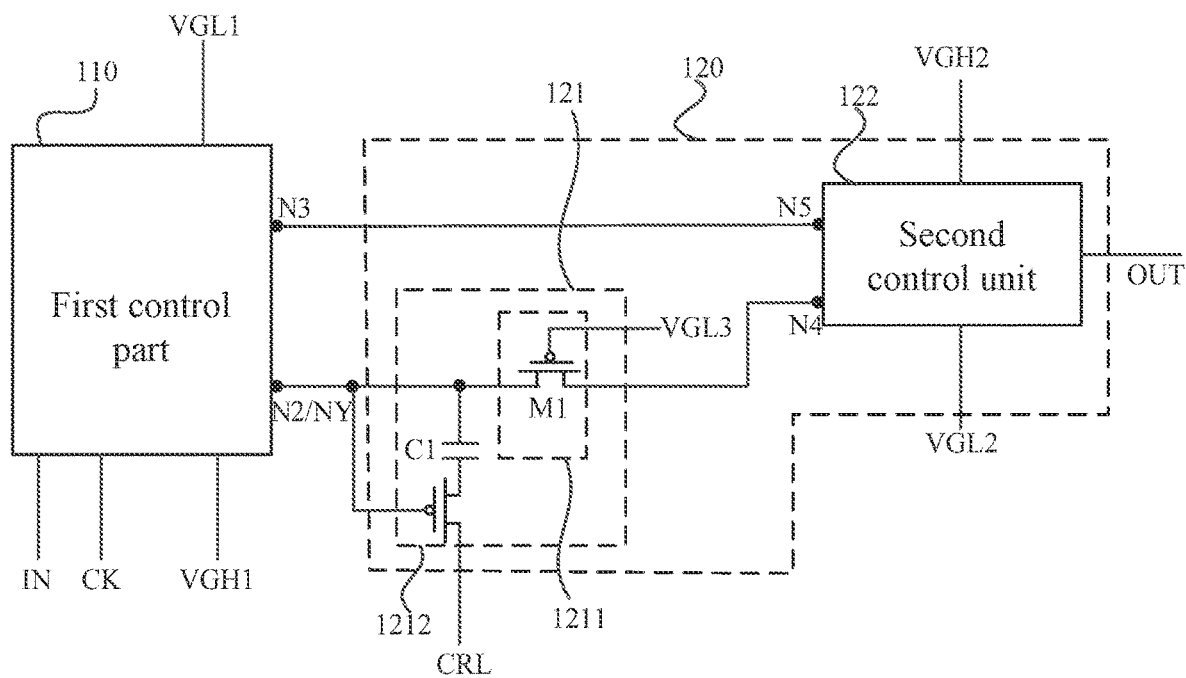
FIG. 15 is a structure diagram of another shift register according to an embodiment of the present disclosure.

FIG. 14 is a structure diagram of a shift register according to an embodiment of the present disclosure. FIG. 15 is a structure diagram of another shift register according to an embodiment of the present disclosure. The preset node NY of the shift register shown in FIG. 14 is different from the preset node NY of the shift register shown in FIG. 15. Referring to FIGS. 14 and 15, in an embodiment, the first control unit 121 further includes a second gating unit 1212. One terminal of the second gating unit 1212 is connected to the fourth node N4, another terminal of the second gating unit 1212 is configured to receive the first output control signal CRL, and a control terminal of the second gating unit 1212 is connected to the preset node NY. When the preset node NY is a low level signal, the second gating unit 1212 is turned on.

In an embodiment, when the preset node NY is a low level signal, the second gating unit 1212 is turned on, and the first output control signal CRL may be transmitted to the fourth node N4 through the turned-on second gating unit 1212. After the first output control signal CRL transits from a high level signal to a low level signal, the voltage value of the low level signal of the fourth node N4 may be pulled down. In this case, the shift register outputs the third voltage signal VGL2. In addition, since the first output control signal CRL pulls down the signal of the fourth node N4, the shift register may fully output the second voltage signal VGH1, so that tailing can be avoided. When the preset node NY is a high level signal, the second gating unit 1212 is turned off, and the first output control signal CRL cannot be transmitted to the fourth node N4. In this case, the shift register outputs the fourth voltage signal VGH2.

It is to be understood that the second gating unit 1212 is provided so that it is ensured that only when the preset node NY is a low level signal, the first output control signal CRL is connected to the shift register at this stage, and the first output control signal CRL is not allowed to affect the potential of the fourth node N4 at other times. In this manner, it can be ensured that the circuit is more stable when the preset node NY is a high level signal.

It is also to be understood that the signal of the preset node NY controls the turning on and off of the second gating unit 1212 so that the circuit structure only for generating the control signal of the second gating unit 1212 in the driver chip 20 can be omitted, which is conducive to further reducing the cost. In addition, the signal line for transmitting the control signal of the second gating unit 1212 between the driver chip 20 and the driver circuit 10 can also be omitted, which is conducive to further narrowing the frame.

With continued reference to FIGS. 14 and 15, in an embodiment, the second gating unit 1212 includes a second transistor M2, where a source of the second transistor M2 is configured to receive the first output control signal CRL, a drain of the second transistor M2 is connected to the fourth node N4, and a gate of the second transistor M2 is connected to the preset node NY.

In an embodiment, the second transistor M2 is a PMOS type transistor. In an embodiment, the drain of the second transistor M2 is connected to the first electrode plate of the first capacitor C1.

It is to be understood that the second gating unit 1212 includes the second transistor M2 so that the structure of the second gating unit can be simplified, which is conducive to simplifying the structure of the shift register.

In an embodiment, when the preset node NY is the third node N3 and the input signal IN of the shift register is a low level signal, the output signal OUT is a low level signal. In this manner, it can be ensured that when the preset node NY is a low level signal, the output signal OUT is a low level signal.

In an embodiment, when the third node N3 is the preset node NY and the input signal IN is a low level signal, it can be ensured that when the preset node NY is a low level signal, the output signal OUT is a low level signal. Hereinafter, a detailed description will be given in conjunction with typical examples of the first control part 110, and repetition is not made here.

In an embodiment, when the preset node NY is the second node N2 and the input signal IN of the shift register is a high level signal, the output signal OUT is a low level signal. In this manner, it can be ensured that when the preset node NY is a low level signal, the output signal OUT is a low level signal.

In an embodiment, when the second node N2 is the preset node NY and the input signal IN is a high level signal, it can be ensured that when the preset node NY is a low level signal, the output signal OUT is a low level signal. Hereinafter, a detailed description will be given in conjunction with typical examples of the first control part 110, and repetition is not made herein.

With continued reference to FIG. 2, in an embodiment, in the N stages of shift registers of the driver circuit 10, the signal of the third node N3 of the shift register at the M1-th stage is connected to an input signal IN terminal of the shift register at the (M1+1)-th stage and is used as the input signal IN of the shift register at the (M1+1)-th stage, where 1≤M1≤N.

In an embodiment, the signal of the third node N3 of the shift register at this stage is the input signal IN of the shift register at the next stage so that the cascade of the N stages of shift registers can be achieved. The input signal IN of the shift register at the first stage may be provided by the driver chip 20.

Figure 16:
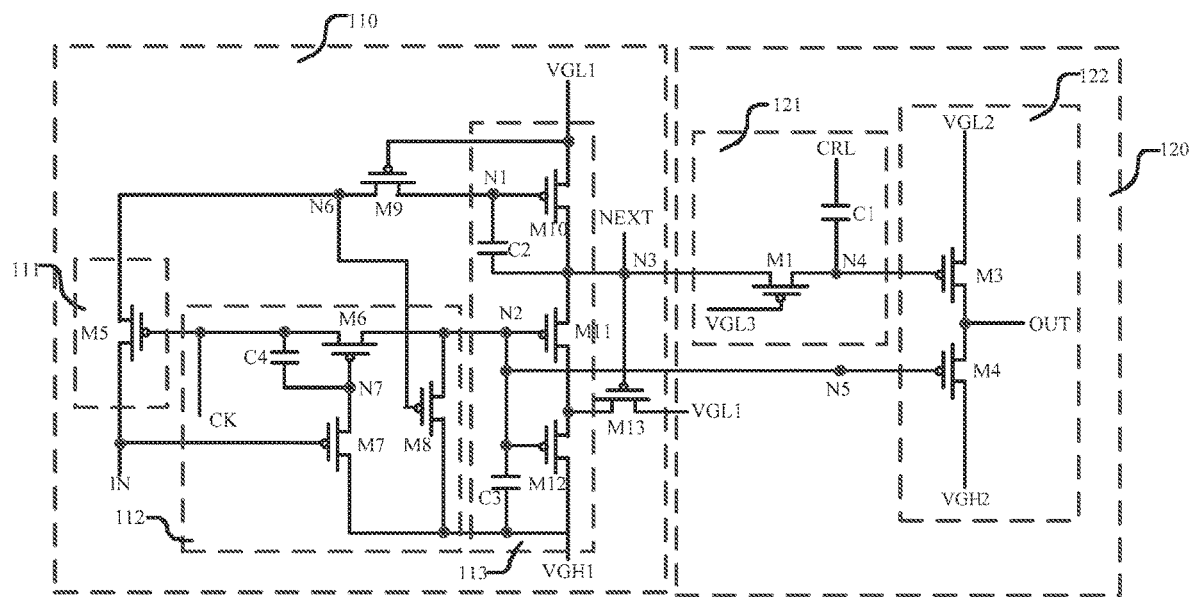
FIG. 16 is a circuit element diagram of a shift register according to an embodiment of the present disclosure.
Figure 17:
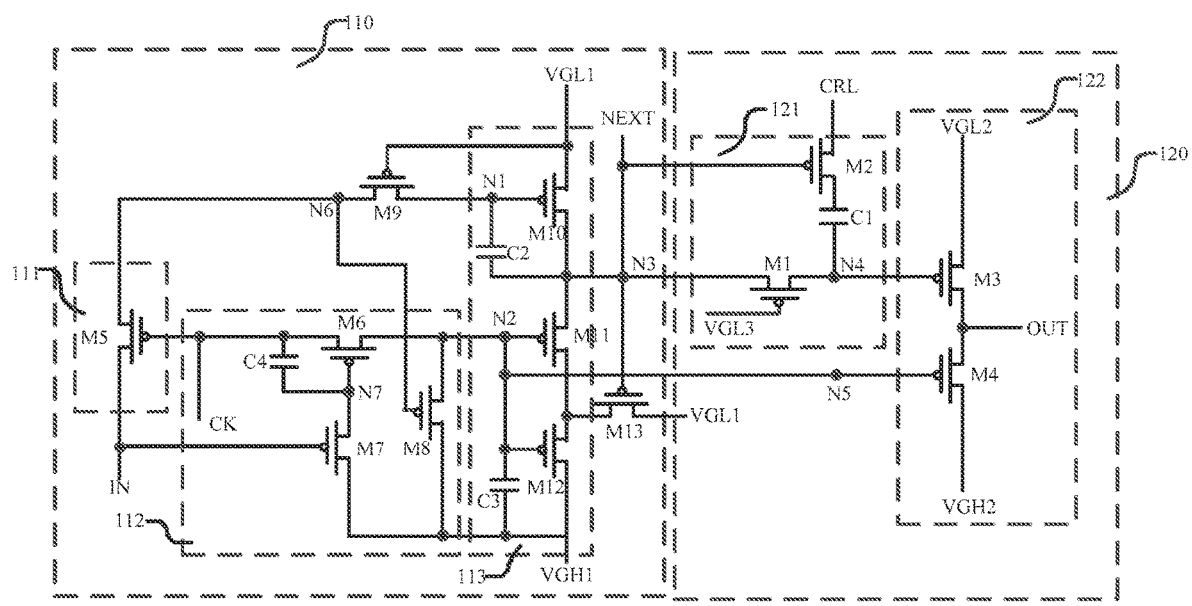
FIG. 17 is a circuit element diagram of another shift register according to an embodiment of the present disclosure.
Figure 18:
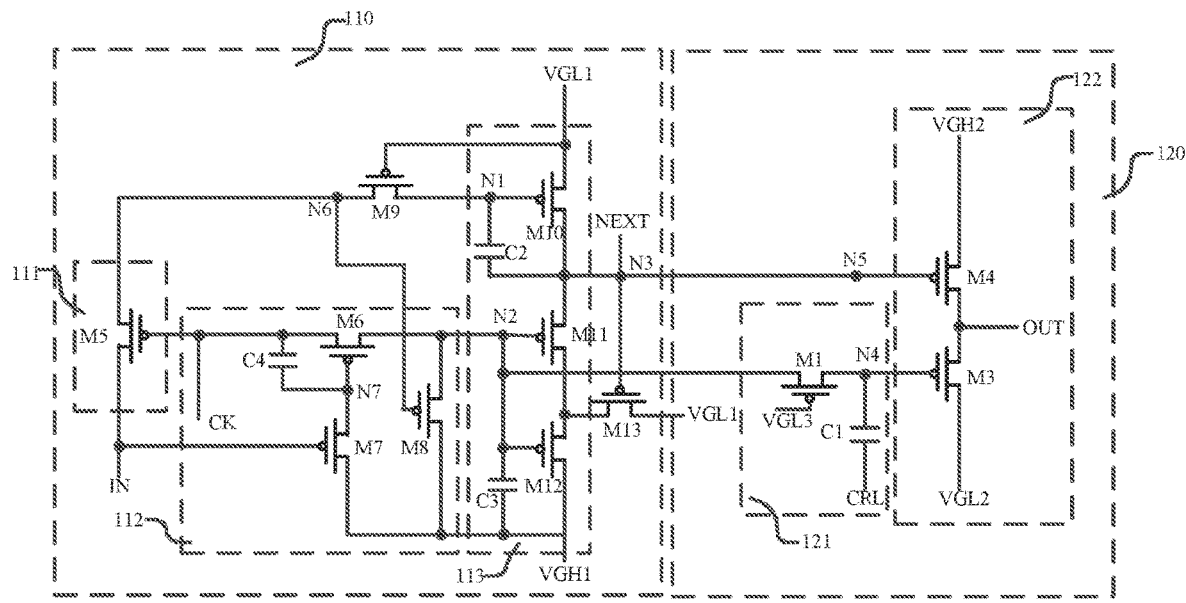
FIG. 18 is a circuit element diagram of another shift register according to an embodiment of the present disclosure.
Figure 19:
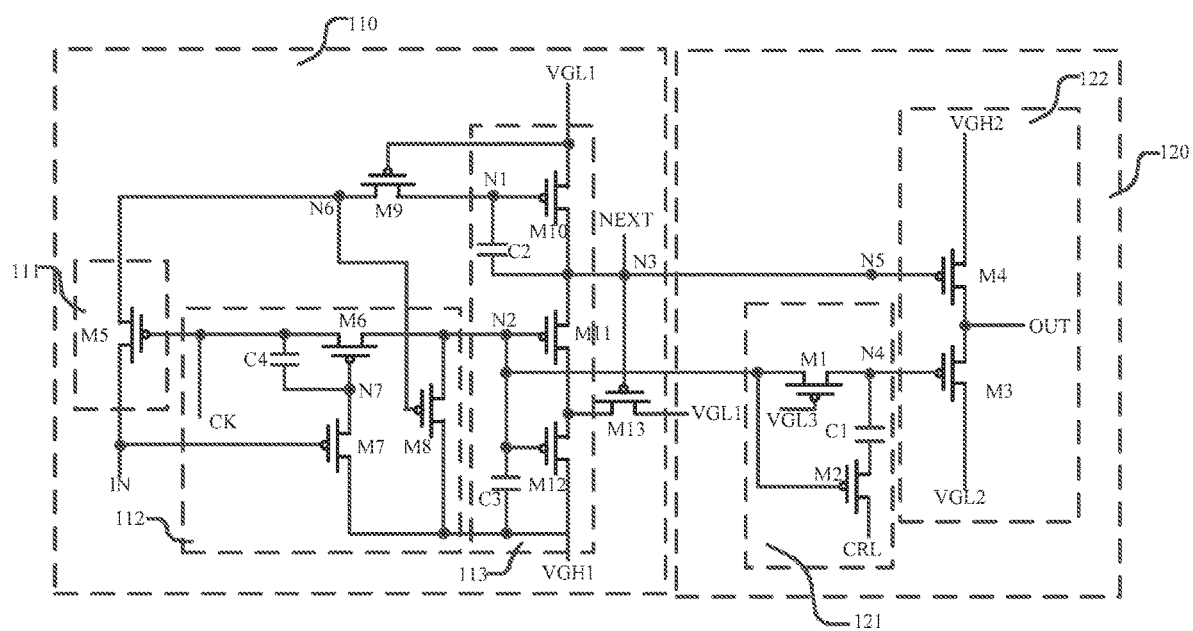
FIG. 19 is a circuit element diagram of another shift register according to an embodiment of the present disclosure.

FIG. 16 is a circuit element diagram of a shift register according to an embodiment of the present disclosure. FIG. 17 is a circuit element diagram of another shift register according to an embodiment of the present disclosure. FIG. 18 is a circuit element diagram of another shift register according to an embodiment of the present disclosure. FIG. 19 is a circuit element diagram of another shift register according to an embodiment of the present disclosure. In the shift register shown in FIG. 16 and the shift register shown in FIG. 17, the third node N3 is set as the preset node. In the shift register shown in FIG. 18 and the shift register shown in FIG. 19, the second node N2 is set as the preset node. Each of the first control unit 121 of the shift register shown in FIG. 16 and the first control unit 121 of the shift register shown in FIG. 18 includes the first gating unit 1211. Each of the first control unit 121 of the shift register shown in FIG. 17 and the first control unit 121 of the shift register shown in FIG. 19 includes the first gating unit 1211 and the second gating unit 1212. With continued reference to FIGS. 16 to 19, in an embodiment, the second control unit 122 includes a third transistor M3 and a fourth transistor M4, where a source of the third transistor M3 is configured to receive the third voltage signal VGL2, a drain of the third transistor M3 is connected to an output signal OUT terminal, and a gate of the third transistor M3 is connected to the fourth node N4; a source of the fourth transistor M4 is configured to receive the fourth voltage signal VGH2, a drain of the fourth transistor M4 is connected to the output signal OUT terminal, and a gate of the fourth transistor M4 is connected to the fifth node N5. That is, the first sub-control unit 1221 includes the third transistor M3, and the second sub-control unit 1222 includes the fourth transistor M4.

In an embodiment, the third transistor M3 and the fourth transistor M4 are both PMOS type transistors.

In an embodiment, when the fourth node N4 is at a low level, the third transistor M3 is turned on, the third voltage signal VGL2 is transmitted to the drain of the third transistor M3, and the output signal OUT is generated. When the fourth node N4 is at a high level, the third transistor M3 is turned off. When the fifth node N5 is at a low level, the fourth transistor M4 is turned on, the fourth voltage signal VGH2 is transmitted to the drain of the fourth transistor M4, and the output signal OUT is generated. When the fifth node N5 is at a high level, the fourth transistor M4 is turned off. That is, the low level signal of the output signal OUT is determined by the fourth node N4, and the high level signal of the output signal OUT is determined by the fifth node N5.

It is to be understood that the third transistor M3 and the fourth transistor M4 respectively generate output signals OUT under the control of the fourth node N4 and the fifth node N5, the high level signal of the fourth node N4 and the high level signal of the fifth node N5 are the second voltage signal VGH1, the low level signal of the fourth node N4 includes the first voltage signal VGL1 and a low level signal with a voltage value lower than the voltage value of the first voltage signal VGL1, and the low level signal of the fifth node N5 is the first voltage signal VGL1. That is, control signals of the second control unit 122 are the first voltage signal VGL1, the low level signal with a voltage value lower than the voltage value of the first voltage signal VGL1, and the second voltage signal VGH1; and received signals of the second control unit 122 are the third voltage signal VGL2 and the fourth voltage signal VGH2.

Therefore, when the potential of the first voltage signal VGL1 is lower than the potential of the third voltage signal VGL2, and/or the potential of the second voltage signal VGH1 is higher than the potential of the fourth voltage signal VGH2, the voltage value of the control signal of the second control unit 122 is higher than or lower than the voltage value of the received signal.

For the PMOS type third transistor M3 and the PMOS type fourth transistor M4, when a low level signal is received and the voltage value of the control signal is lower than the voltage value of the received low level signal, it can be ensured that the PMOS type transistors operate in a relatively saturated state, so that the stability of the output signal OUT can be ensured, and the tailing of the signal output can be weakened. In addition, when the control signal is a higher high level signal, if the signal received by the PMOS type transistor is also a high level signal, it can be ensured that the PMOS type transistor may be fully turned off, and the risk of electric leakage can be fully reduced. Therefore, in embodiments of the present disclosure, the stability of the output waveform can be fully improved, and the occurrence of problems such as tailing and leakage current can be avoided.

With continued reference to FIG. 6 and FIGS. 16 to 19, in an embodiment, the first control part 110 includes a third control unit 111, a fourth control unit 112, and a fifth control unit 113. The third control unit 111 is configured to receive the input signal IN and control a signal of a sixth node N6 in response to the first clock signal, where the sixth node N6 is connected to the first node N1. The fourth control unit 112 is configured to receive the second voltage signal VGH1 and control the signal of the second node N2 in response to at least the input signal IN and the signal of the sixth node N6. The fifth control unit 113 is configured to receive the first voltage signal VGL1 and the second voltage signal VGH1 and control the signal of the third node N3 in response to the signal of the first node N1 and the signal of the second node N2.

With continued reference to FIG. 6 and FIGS. 16 to 19, in an embodiment, the third control unit 111 includes a fifth transistor M5, the fourth control unit 112 includes a sixth transistor M6, a seventh transistor M7, an eighth transistor M8, and a fourth capacitor C4, and the fifth control unit 113 includes a tenth transistor M10, an eleventh transistor M11, a twelfth transistor M12, a second capacitor C2, and a third capacitor C3. A source of the fifth transistor M5 is connected to the input signal IN, a drain of the fifth transistor M5 is connected to the sixth node N6, and a gate of the fifth transistor M5 is connected to the first clock signal. A source of the sixth transistor M6 is connected to the first clock signal, a drain of the sixth transistor M6 is connected to the second node N2, and a gate of the sixth transistor M6 is connected to a seventh node N7. A source of the seventh transistor M7 is connected to the first voltage signal VGL1, a drain of the seventh transistor M7 is connected to the seventh node N7, and a gate of the seventh transistor M7 is connected to the input signal IN. A source of the eighth transistor M8 is connected to the first voltage signal VGL1, a drain of the eighth transistor M8 is connected to the second node N2, and a gate of the eighth transistor M8 is connected to the sixth node N6. A first electrode plate of the fourth capacitor C4 is connected to the first clock signal, and a second electrode plate of the fourth capacitor C4 is connected to the seventh node N7. A source of the tenth transistor M10 is connected to the second voltage signal VGH1, a drain of the tenth transistor M10 is connected to the third node N3, and a gate of the tenth transistor M10 is connected to the first node N1. A drain of the eleventh transistor M11 is connected to the third node N3, and a gate of the eleventh transistor M11 is connected to the second node N2. A source of the twelfth transistor M12 is connected to the first voltage signal VGL1, a drain of the twelfth transistor M12 is connected to a source of the eleventh transistor M11, and a gate of the twelfth transistor M12 is connected to the second node N2. A first electrode plate of the second capacitor C2 is connected to the first node N1, and a second electrode plate of the second capacitor C2 is connected to the third node N3. A first electrode plate of the third capacitor C3 is connected to the second node N2, and a second electrode plate of the third capacitor C3 is connected to the first voltage signal VGL1.

With continued reference to FIG. 6 and FIGS. 16 to 19, in an embodiment, the first control part 110 further includes a ninth transistor M9 and a thirteenth transistor M13. A source of the ninth transistor M9 is connected to the first node N1, a drain of the ninth transistor M9 is connected to the sixth node N6, and a gate of the ninth transistor M9 is connected to the second voltage signal VGH1. A source of the thirteenth transistor M13 is connected to the second voltage signal VGH1, a drain of the thirteenth transistor M13 is connected to the source of the eleventh transistor M11, and a gate of the thirteenth transistor M13 is connected to the third node N3.

Figure 20:
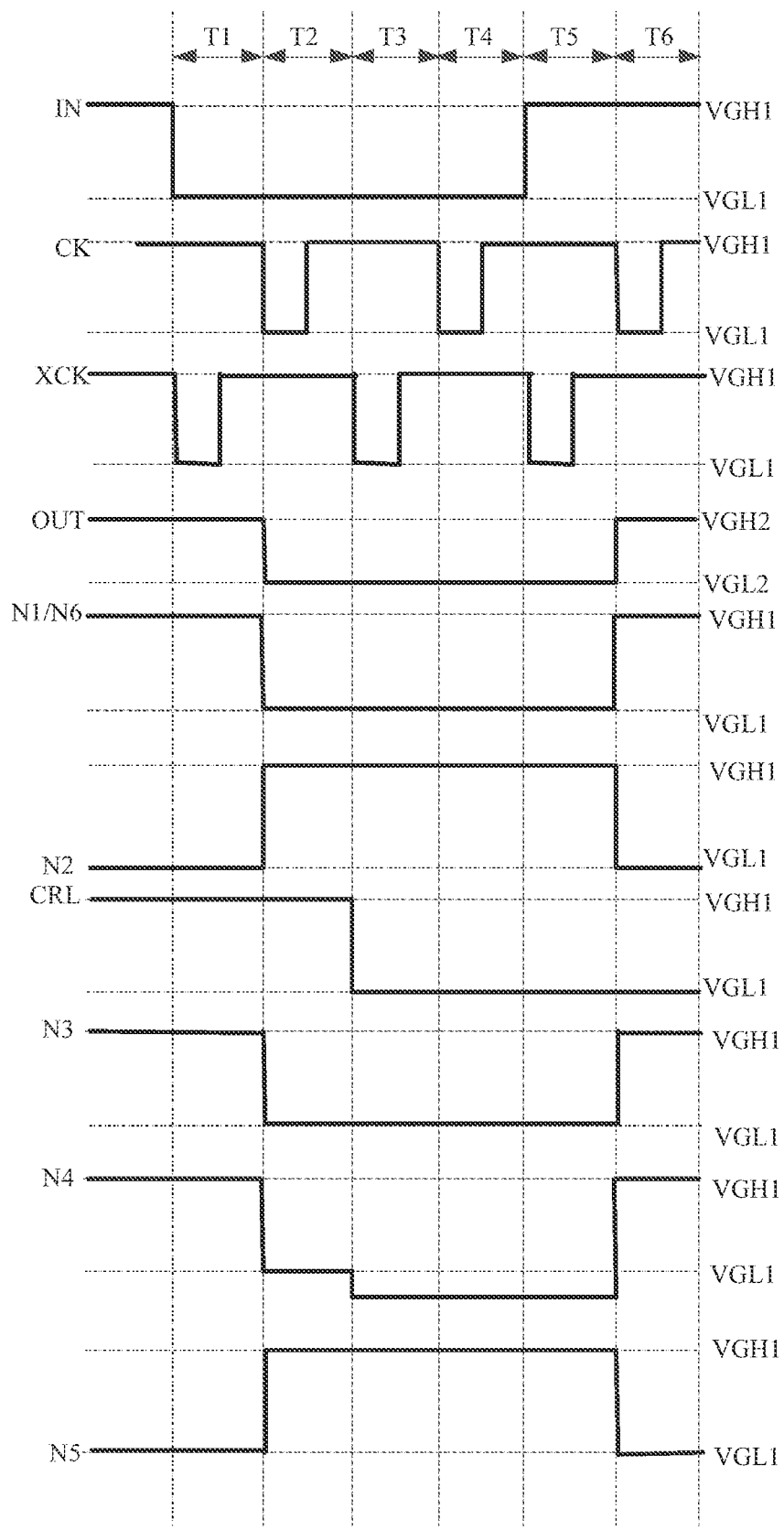
FIG. 20 is a timing sequence diagram of a shift register according to an embodiment of the present disclosure.

For example, FIG. 20 is a timing sequence diagram of a shift register according to an embodiment of the present disclosure. The timing sequence diagram shown in FIG. 20 is applicable to the shift registers shown in FIGS. 16 and 17, where the signal of the third node N3 of the shift register at this stage is used as the input signal IN of the shift register at the next stage, and the signal of the third node N3 of the shift register at the next stage is used as the first output control signal CRL of the shift register at this stage. Referring to FIGS. 16 and 20, the operating process of the shift register shown in FIG. 16 is described below.

In a T1 stage, the input signal IN is at a low level, the first clock signal (the CK signal) is at a high level, the fifth transistor M5 is turned off, the seventh transistor M7 is turned on, the turned-on seventh transistor M7 transmits the first voltage signal VGH1 to the seventh node N7, the sixth node N6 is maintained at a high level, the eighth transistor M8 is turned off, the second node N2 is maintained at a low level, and the fifth node N5 is maintained at a low level, so that the fourth transistor M4 is turned on. Since the ninth transistor M9 is normally on, the level of the first node N1 and the level of the sixth node N6 are the same and are both high, so that the tenth transistor M10 is turned off, and the second node N2 is at a low level; the eleventh transistor M11 and the twelfth transistor M12 are turned on, and the first voltage signal VGH1 is transmitted to the third node N3; the third node N3 is at a high level; the first transistor M1 is turned on, and the turned-on first transistor M1 transmits the high level of the third node N3 to the fourth node N4; and the third transistor M3 is turned off. The fourth voltage signal VGH2 is transmitted to an output terminal through the turned-on fourth transistor M4, so that the output signal OUT is at a high level.

In a T2 stage, the input signal IN is at a low level, the first clock signal (the CK signal) is at a low level, the fifth transistor M5 is turned on, and the input signal IN is transmitted to the sixth node N6, so that the sixth node N6 is at a low level; the first node N1 is at a low level, the tenth transistor M10 is turned on, and the first voltage signal VGL1 is transmitted to the third node N3; the first transistor M1 is turned on, and the low level of the third node N3 is transmitted to the fourth node N4 through the turned-on first transistor M1; the third transistor M3 is turned on, the seventh transistor M7 is turned on, and the second voltage signal VGH1 is transmitted to the seventh node N7; the seventh node N7 is at a high level, the sixth transistor M6 is turned off, the low level of the sixth node N6 turns on the eighth transistor M8, and the high level of the first voltage signal VGH1 is transmitted to the second node N2; the fifth node N5 is at a high level; the fourth transistor M4 is turned off, and the third voltage signal VGL2 is transmitted to the output terminal through the turned-on third transistor M3; and the output signal OUT is at a low level.

In a T3 stage, the input signal IN is at a low level, and the first clock signal (the CK signal) is at a high level; under the action of the fourth capacitor C4, the seventh node N7 is at a high level, the fifth transistor M5 is turned off, the sixth node N6 is maintained at a low level, the first node N1 is maintained at a low level, the tenth transistor M10 is turned on, and the third node N3 is maintained at a low level. Since the first output control signal CRL and the signal of the preset node (the third node N3) are both at a low level, the first transistor M1 is turned off, the fourth node N4 becomes a low level with a lower voltage value under the action of the first output control signal CRL, the third transistor M3 is kept on, the high level of the seventh node N7 turns off the sixth transistor M6, the second node N2 is maintained at a high level, the fifth node N5 is at a high level, the fourth transistor M4 is kept off, and the output signal OUT is at a low level.

In a T4 stage, the input signal IN is at a low level, the first clock signal (the CK signal) is at a low level, the fifth transistor M5 is turned on, and the input signal IN is transmitted to the sixth node N6, so that the sixth node N6 is maintained at a low level, and the first node N1 is maintained at a low level; the third node N3 is maintained at a low level, the first transistor M1 is turned off, the fourth node N4 is maintained at a low level with a lower voltage value, the seventh transistor M7 is turned on, and the second voltage signal VGH1 is transmitted to the seventh node N7; the seventh node N7 is at a high level, the sixth transistor M6 is turned off, the second node N2 is maintained at a high level, the fifth node N5 is maintained at a high level, and the output signal OUT is maintained at a low level.

In a T5 stage, the input signal IN is at a high level, the first clock signal (the CK signal) is at a high level, the fifth transistor M5 is turned off, the sixth node N6 is maintained at a low level, and the first node N1 is maintained at a low level, so that the third node N3 is maintained at a low level, the first transistor M1 is turned off, and the fourth node N4 is maintained at a low level with a lower voltage value; under the action of the fourth capacitor C4, the seventh node N7 is at a high level, the sixth transistor M6 is turned off, and the second node N2 is maintained at a high level; the fifth node N5 is at a high level, and the output signal OUT is maintained at a low level.

In a T6 stage, the input signal IN is at a high level, the first clock signal (the CK signal) is at a low level, the fifth transistor M5 is turned on, the seventh transistor M7 is turned off, and the turned-on fifth transistor M5 transmits the input signal IN to the sixth node N6, so that the sixth node N6 is at a high level, and the first node N1 is at a high level; under the action of the fourth capacitor C4, the seventh node N7 is at a low level; the sixth transistor M6 is turned on, and the turned-on sixth transistor M6 transmits the low level of the first clock signal (the CK signal) to the second node N2; the eleventh transistor M11 and the twelfth transistor M12 are turned on, the second voltage signal VGH1 is transmitted to the third node N3 through the turned-on eleventh transistor M11 and the turned-on twelfth transistor M12, the first transistor M1 is turned on, the high level of the third node N3 is transmitted to the fourth node N4, the third transistor M3 is turned off, the low level of the second node N2 causes the fifth node N5 to be at a low level, and the fourth transistor M4 is turned on; and the output signal OUT is at a high level.

With continued reference to FIG. 20, it is to be noted that the fourth node N4 and the preset node (the third node N3) are both low level signals in the T2 to T5 stages, and at the junction of the T2 stage and the T3 stage, the first output control signal CRL transits from a high level signal to a low level signal, and the fourth node N4 transits from a low level signal to a low level signal with a lower voltage value through the coupling effect of the first capacitor C1, so that the third transistor M3 can be turned on more fully, and thus tailing can be avoided. It is also to be noted that in the T3 to T5 stages, when the signal of the preset node (the third node N3) and the first output control signal CRL are both low level signals, the fifth voltage signal VGL3 controls the first transistor M1 to be turned off. In this manner, the signal change of the fourth node N4 can be prevented from returning to the preset node NY, to prevent the signal change of the fourth node N4 from causing the signal change of the preset node NY. The signal of the third node N3 is the input of the shift register at the next stage. In this manner, the output of the shift register at the next stage can be prevented from being affected.

With continued reference to FIGS. 17 and 20, the operating timing sequence of the shift register shown in FIG. 17 is similar to the operating timing sequence of the shift register shown in FIG. 16. The difference is that in the T2 to T5 stages, the preset node (the third node N3) is a low level signal, the second transistor M2 is turned on, and the first output control signal CRL may act on the fourth node N4 through the first capacitor C1; in the T1 and T6 stages, the preset node (the third node N3) is a low level signal, the second transistor M2 is turned off, and the first output control signal CRL cannot be transmitted to the first capacitor C1. In this manner, it can be ensured that only when the preset node (the third node N3) is a low level signal, the first output control signal CRL is connected to the shift register at this stage, and the first output control signal CRL is not allowed to affect the potential of the fourth node N4 at other times. In this manner, it can be ensured that the circuit is more stable when the preset node (the third node N3) is a high level signal.

It is to be noted that, as shown in FIG. 20, in the case of |M1−M2|=1, that is, M2 is the next stage or the previous stage of M1. Herein, the case where M2 is the next stage of M1 is used as an example. In this case, the first clock signal received by the shift register at the M1-th stage is the CK signal, the first clock signal received by the shift register at the M2-th stage is the XCK signal, and the input signal of the shift register at the M2-th stage is the signal of the third node N3 of the shift register at the M1-th stage. When the XCK signal changes from a high level to a low level, that is, when the T3 stage in FIG. 20 starts, the signal of the third node N3 of the shift register at the M2-th stage becomes a low level signal, so that the first output control signal CRL becomes a low level signal. In this case, the first output control signal CRL pulls down the potential of the fourth node N4, so that the stable output of the low level output signal of the shift register at the M1-th stage can be ensured.

In addition, it is to be noted that, as described above, since the effective pulse time of the CK signal and the effective pulse time of the XCK signal do not overlap, and to fully simplify the process, the waveform of the CK signal is often the same as the waveform of the XCK signal, and the difference only exists in the timing. In this case, when each of the CK signal and the XCK signal transits once, the output signal of the shift register is shifted twice toward the next stage and the stage next to the next stage. In conjunction with the preceding analysis, when the pulse period of the first clock signal is S1, the width of the low level pulse of the output signal OUT is S2, where S2=a×S1. Since when the first clock signal passes through one pulse period, each of the CK signal and the XCK signal transits once, then in the case of i≤2a, during at least part of the time period during which the shift register at the M1-th stage outputs a low level output signal OUT, the signal of the preset node of the shift register at the M2-th stage may be a low level signal and may be used as the first output control signal CRL received by the shift register at the M1-th stage, so that the potential of the fourth node N4 can be pulled down, and the stable output of the low level output signal OUT can be ensured.

Figure 21:
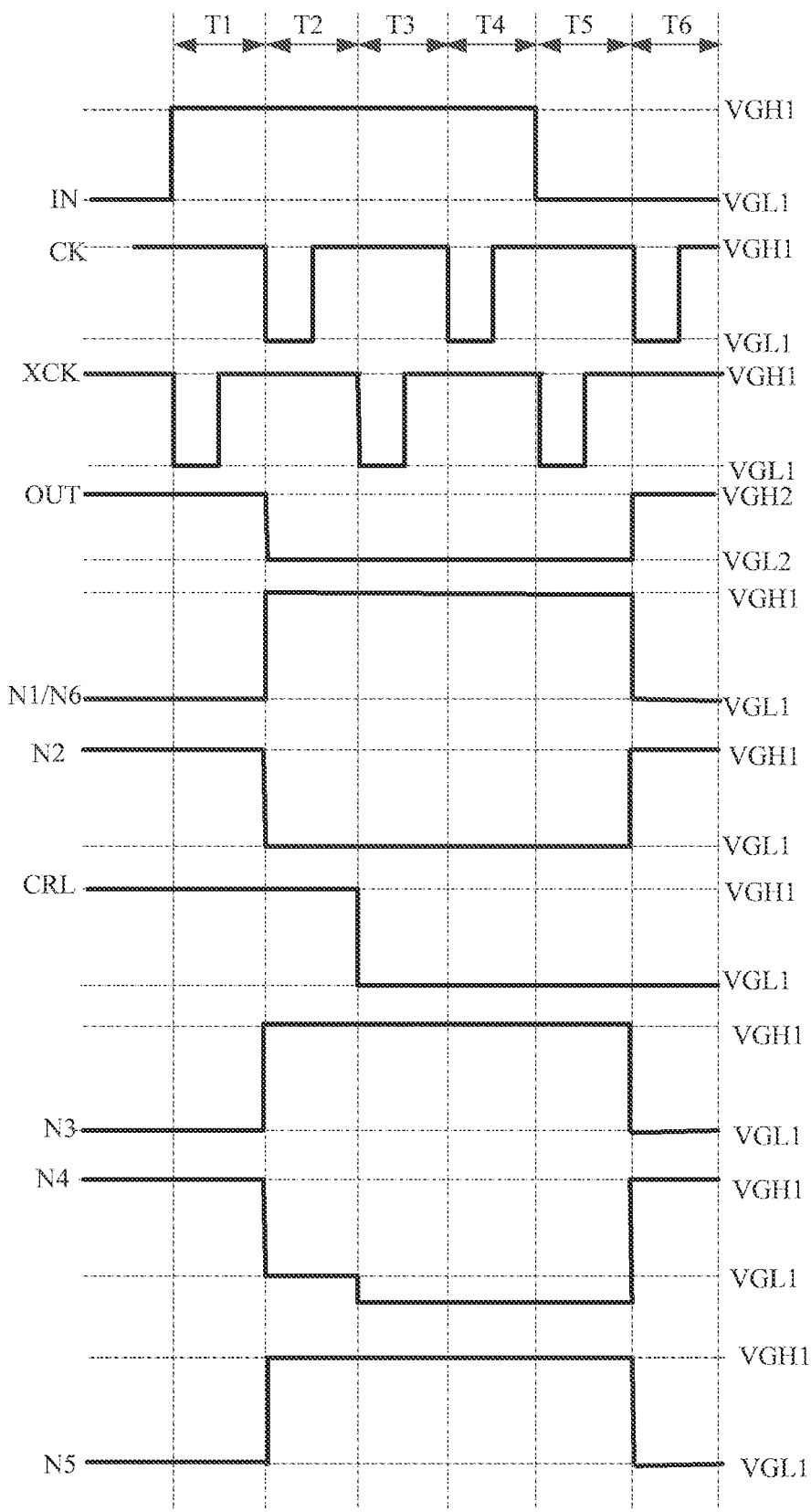
FIG. 21 is a timing sequence diagram of another shift register according to an embodiment of the present disclosure.

For example, FIG. 21 is a timing sequence diagram of another shift register according to an embodiment of the present disclosure. The timing sequence diagram shown in FIG. 21 is applicable to the shift registers shown in FIGS. 18 and 19, where the signal of the third node N3 of the shift register at this stage is used as the input signal IN of the shift register at the next stage, and the signal of the second node N2 of the shift register at the next stage is used as the first output control signal CRL of the shift register at this stage. Referring to FIGS. 18 and 21, the operating process of the shift register shown in FIG. 18 is described below.

In a T1 stage, the input signal IN is at a high level, the first clock signal (the CK signal) is at a high level, the fifth transistor M5 and the seventh transistor M7 are turned off, the seventh node N7 is maintained at a high level, the sixth node N6 is maintained at a low level, the eighth transistor M8 is turned on, and the second voltage signal VGH1 is transmitted to the second node N2, so that the second node N2 is at a high level; the eleventh transistor M11 and the twelfth transistor M12 are turned off, the first transistor M1 is turned on, and the high level of the second node N2 is transmitted to the fourth node N4; and the third transistor M3 is turned off. Since the ninth transistor M9 is normally open, the level of the first node N1 and the level of the sixth node N6 are the same and are both low, so that the tenth transistor M10 is turned on, and the first voltage signal VGL1 is transmitted to the third node N3; the third node N3 is at a low level, and the fifth node N5 is at a low level; the fourth transistor M4 is turned on, and the fourth voltage signal VGH2 is transmitted to the output terminal; and the output signal OUT is at a high level.

In a T2 stage, the input signal IN is at a high level, the first clock signal (the CK signal) is at a low level, the fifth transistor M5 is turned on, and the input signal IN is transmitted to the sixth node N6, so that the sixth node N6 is at a high level; the first node N1 is at a high level, and the tenth transistor M10 is turned off; under the action of the fourth capacitor C4, the seventh node N7 is at a low level, the sixth transistor M6 is turned on, and the first clock signal (the CK signal) is transmitted to the second node N2; the second node N2 is at a low level, the eleventh transistor M11, the twelfth transistor M12, and the first transistor M1 are turned on, and the second voltage signal VGH1 is transmitted to the third node N3; the third node N3 is at a high level, and the fifth node N5 is at a high level; the fourth transistor M4 is turned off, the first transistor M1 is turned on, and the low level of the second node N2 is transmitted to the fourth node N4; the third transistor M3 is turned on, and the turned-on third transistor M3 transmits the second voltage signal VGL2 to the output terminal; and the output signal OUT is at a low level.

In a T3 stage, the input signal IN is at a high level, and the first clock signal (the CK signal) is at a high level; under the action of the fourth capacitor C4, the seventh node N7 is at a high level, the fifth transistor M5 is turned off, the sixth node N6 is maintained at a high level, the first node N1 is maintained at a high level, the sixth transistor M6 and the eighth transistor M8 are turned off, and the second node N2 is maintained at a low level. Since the first output control signal CRL and the signal of the preset node (the second node N2) are both at low levels, the first transistor M1 is turned off, the fourth node N4 becomes a low level with a lower voltage value under the action of the first output control signal CRL, the third transistor M3 is kept on, the third node N3 is maintained at a high level, the fifth node N5 is maintained at a high level, the fourth transistor M4 is kept off, and the output signal OUT of M3 is at a low level.

In a T4 stage, the input signal IN is at a high level, the first clock signal (the CK signal) is at a low level, the fifth transistor M5 is turned on, and the input signal IN is transmitted to the sixth node N6, so that the sixth node N6 is maintained at a high level, and the first node N1 is maintained at a high level; under the action of the fourth capacitor C4, the seventh node N7 is at a low level, the sixth transistor M6 is turned on, and the first clock signal (the CK signal) is transmitted to the second node N2; the second node N2 is maintained at a low level, the fourth node N4 is maintained at a low level with a lower voltage value, the third node N3 is maintained at a high level, the fifth node N5 is maintained at a high level, and the output signal OUT is maintained at a low level.

In a T5 stage, the input signal IN is at a low level, the first clock signal (the CK signal) is at a high level, the fifth transistor M5 is turned off, the sixth node N6 is maintained at a high level, the first node N1 is maintained at a high level, the seventh transistor M7 is turned on, and the second voltage signal VGL1 is transmitted to the seventh node N7, so that the seventh node N7 is at a high level; and the second node N2 is maintained at a low level, the fourth node N4 is maintained at a low level with a lower voltage value, the third node N3 is maintained at a high level, the fifth node N5 is maintained at a high level, and the output signal OUT is maintained at a low level.

In a T6 stage, the input signal IN is at a low level, the first clock signal (the CK signal) is at a low level, the fifth transistor M5 and the seventh transistor M7 are turned on, and the turned-on fifth transistor M5 transmits the input signal IN to the sixth node N6, so that the sixth node N6 is at a low level, the first node N1 is at a low level, and the turned-on seventh transistor M7 transmits the second voltage signal VGH1 to the seventh node N7; the seventh node N7 is at a high level, the sixth transistor M6 is turned off, and the turned-on eighth transistor M8 transmits the second voltage signal VGH1 to the second node N2; the second node N2 is at a high level; the eleventh transistors M11 and the twelfth transistor M12 are turned off, the first transistor M1 is turned on, and the high level of the second node N2 is transmitted to the fourth node N4; the third transistor M3 is turned off, the tenth transistor M10 is turned on, and the first voltage signal VGL1 is transmitted to the third node N3; and the third node N3 is at a low level, the fifth node N5 is at a low level, and the fourth transistor M4 is turned on. The turned-on fourth transistor M4 transmits the fourth voltage signal VGH2 to the output terminal, so that the output signal OUT is at a high level.

With continued reference to FIG. 21, it is to be noted that the fourth node N4 and the preset node (the second node N2) are both low level signals in the T2 to T5 stages, and at the junction of the T2 stage and the T3 stage, the first output control signal CRL transits from a high level signal to a low level signal, and the fourth node N4 transits from a low level signal to a low level signal with a lower voltage value through the coupling effect of the first capacitor C1, so that the third transistor M3 can be turned on more fully, and thus tailing can be avoided. It is also to be noted that in the T3 to T5 stages, when the signal of the preset node (the second node N2) and the first output control signal CRL are both low level signals, the fifth voltage signal VGL3 controls the first transistor M1 to be turned off. In this manner, the signal change of the fourth node N4 can be prevented from returning to the preset node, to prevent the signal change of the fourth node N4 from causing the signal change of the preset node.

With continued reference to FIGS. 19 and 21, the operating timing sequence of the shift register shown in FIG. 19 is similar to the operating timing sequence of the shift register shown in FIG. 18. The difference is that in the T2 to T5 stages, the preset node (the second node N2) is a low level signal, the second transistor M2 is turned on, and the first output control signal CRL may act on the fourth node N4 through the first capacitor C1; and in the T1 and T6 stages, the preset node (the second node N2) is a low level signal, the second transistor M2 is turned off, and the first output control signal CRL cannot be transmitted to the first capacitor C1. In this manner, it can be ensured that only when the preset node (the second node N2) is a low level signal, the first output control signal CRL is connected to the shift register at this stage, and the first output control signal CRL is not allowed to affect the potential of the fourth node N4 at other times. In this manner, it can be ensured that the circuit is more stable when the preset node (the second node N2) is a high level signal.

Figure 22:
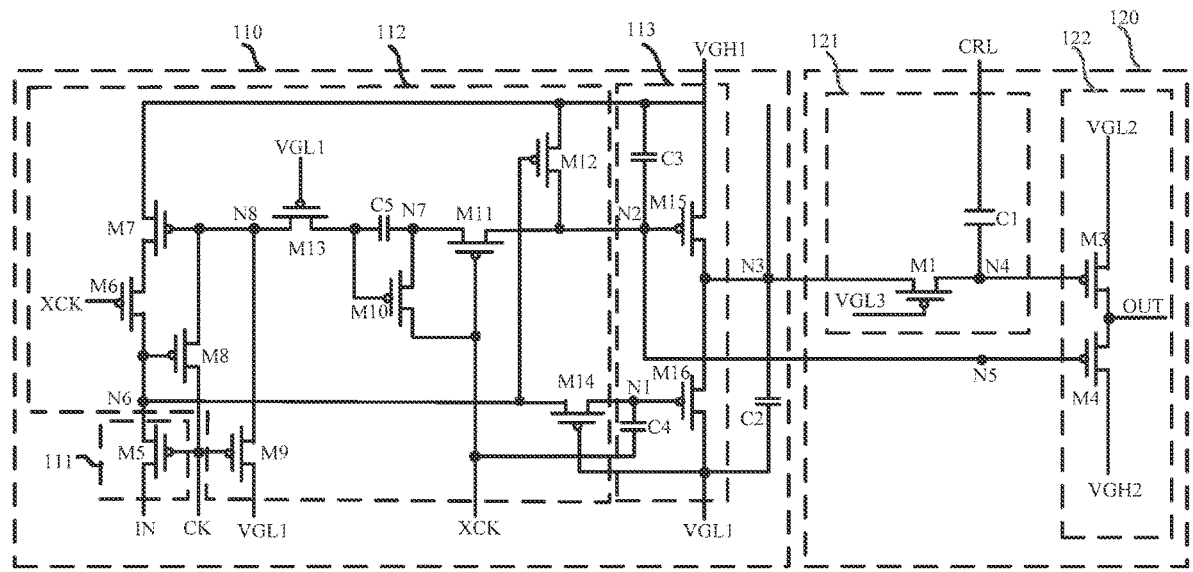
FIG. 22 is a circuit element diagram of a shift register according to an embodiment of the present disclosure.
Figure 23:
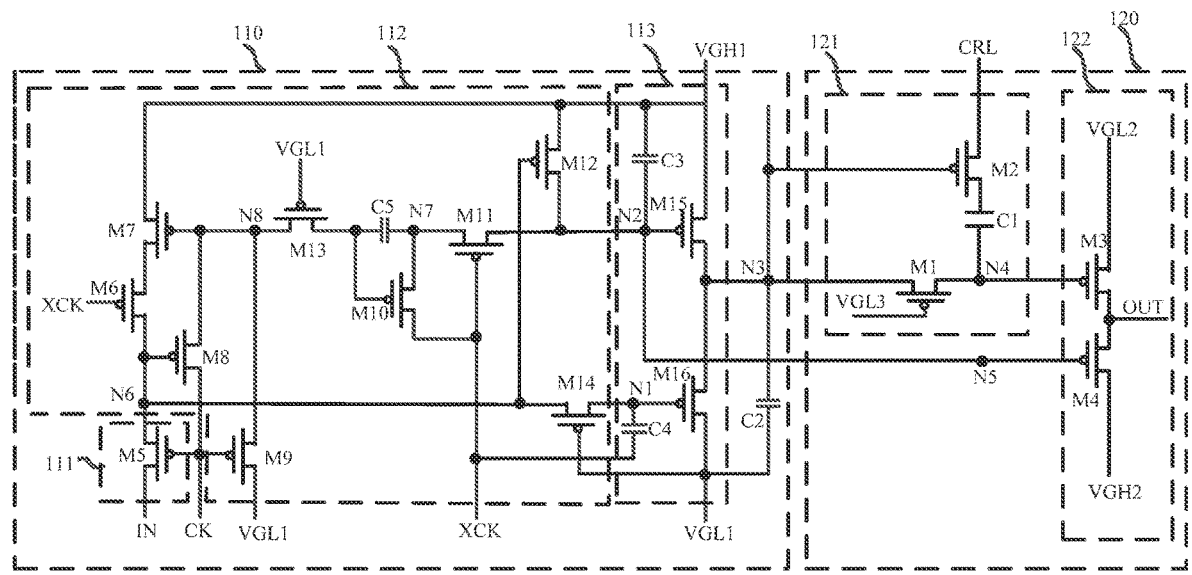
FIG. 23 is a circuit element diagram of another shift register according to an embodiment of the present disclosure.
Figure 24:
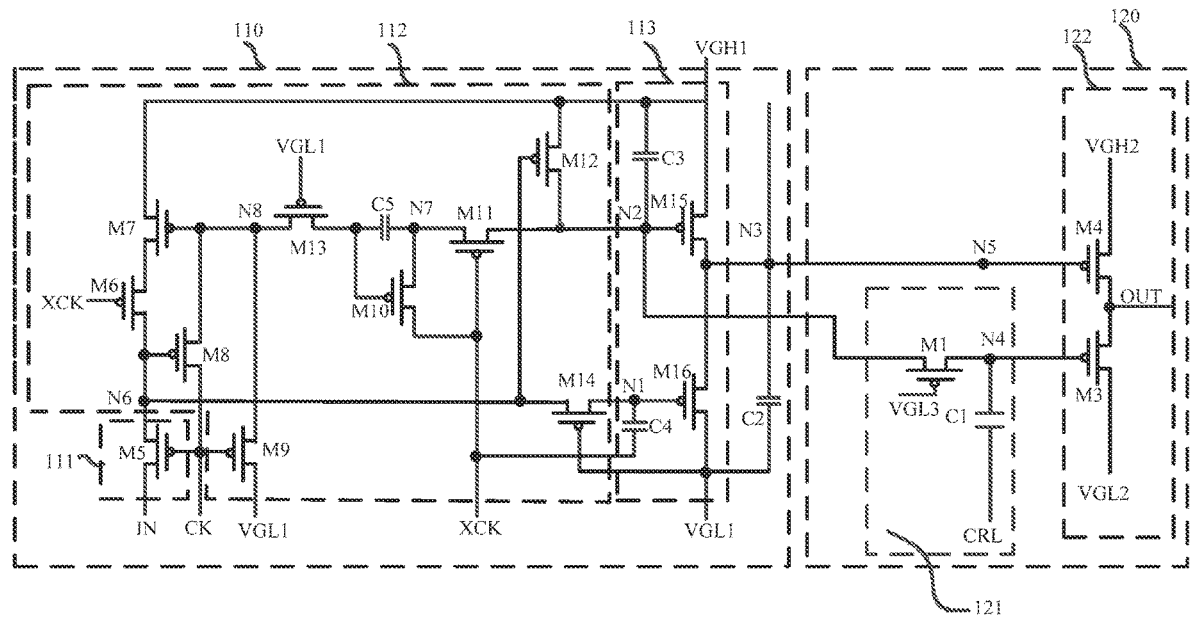
FIG. 24 is a circuit element diagram of another shift register according to an embodiment of the present disclosure.
Figure 25:
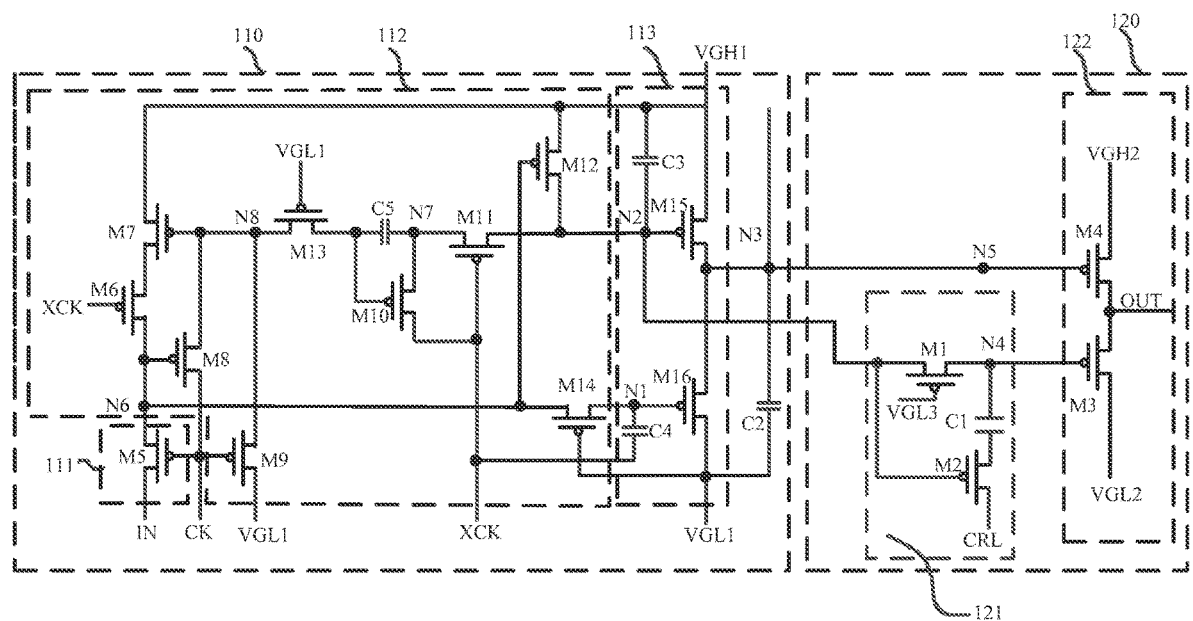
FIG. 25 is a circuit element diagram of another shift register according to an embodiment of the present disclosure.

FIG. 22 is a circuit element diagram of a shift register according to an embodiment of the present disclosure. FIG. 23 is a circuit element diagram of another shift register according to an embodiment of the present disclosure. FIG. 24 is a circuit element diagram of another shift register according to an embodiment of the present disclosure. FIG. 25 is a circuit element diagram of another shift register according to an embodiment of the present disclosure. In the shift register shown in FIG. 22 and the shift register shown in FIG. 23, the third node N3 is set as the preset node. In the shift register shown in FIG. 24 and the shift register shown in FIG. 25, the second node N2 is set as the preset node. Each of the first control unit 121 of the shift register shown in FIG. 22 and the first control unit 121 of the shift register shown in FIG. 24 includes the first gating unit 1211. Each of the first control unit 121 of the shift register shown in FIG. 23 and the first control unit 121 of the shift register shown in FIG. 25 includes the first gating unit 1211 and the second gating unit 1212. With continued reference to FIG. 7 and FIGS. 22 to 25, in an embodiment, the first control part 110 includes the third control unit 111, the fourth control unit 112, and the fifth control unit 113. The third control unit 111 is configured to receive the input signal IN and control the signal of the sixth node N6 in response to the first clock signal, where the sixth node N6 is connected to the first node N1. The fourth control unit 112 is configured to receive the first voltage signal VGL1 and the second voltage signal VGH1 and control the signal of the second node N2 in response to the signal of the sixth node N6, the first clock signal, and the second clock signal. The fifth control unit 113 is configured to receive the first voltage signal VGL1 and the second voltage signal VGH1 and control the signal of the third node N3 in response to the signal of the first node N1 and the signal of the second node N2.

With continued reference to FIGS. 23 to 25, in an embodiment, the third control unit 111 includes the fifth transistor M5, the fourth control unit 112 includes the sixth transistor M6, the seventh transistor M7, the eighth transistor M8, the ninth transistor M9, the tenth transistor M10, the eleventh transistor M11, the twelfth transistor M12, the thirteenth transistor M13, a fourteenth transistor M14, and a fifth capacitor C5; and the fifth control unit 113 includes a fifteenth transistor M15, a sixteenth transistor M16, the third capacitor C3, and the fourth capacitor C4. The source of the fifth transistor M5 is connected to the input signal IN, the drain of the fifth transistor M5 is connected to the sixth node N6, and the gate of the fifth transistor M5 is connected to the first clock signal. The source of the sixth transistor M6 is connected to the sixth node N6, the drain of the sixth transistor M6 is connected to the drain of the seventh transistor M7, and the gate of the sixth transistor M6 is connected to the second clock signal. The source of the seventh transistor M7 is connected to the first voltage signal VGL1, the drain of the seventh transistor M7 is connected to the drain of the sixth transistor M6, and the gate of the seventh transistor M7 is connected to an eighth node N8. The source of the eighth transistor M8 is connected to the first clock signal, the drain of the eighth transistor M8 is connected to the eighth node N8, and the gate of the eighth transistor M8 is connected to the sixth node N6. The source of the ninth transistor M9 is connected to the second clock signal, the drain of the ninth transistor M9 is connected to the eighth node N8, and the gate of the ninth transistor M9 is connected to the first clock signal. The source of the tenth transistor M10 is connected to the second clock signal, the drain of the tenth transistor M10 is connected to the seventh node N7, and the gate of the tenth transistor M10 is connected to the eighth node N8. The source of the eleventh transistor M11 is connected to the seventh node N7, the drain of the eleventh transistor M11 is connected to the second node N2, and the gate of the eleventh transistor M11 is connected to the second clock signal. The source of the twelfth transistor M12 is connected to the first voltage signal VGL1, the drain of the twelfth transistor M12 is connected to the second node N2, and the gate of the twelfth transistor M12 is connected to the sixth node N6. The source of the thirteenth transistor M13 is connected to the eighth node N8, the drain of the thirteenth transistor M13 is connected to the gate of the tenth transistor M10, and the gate of the thirteenth transistor M13 is connected to the second voltage signal VGH1. A source of the fourteenth transistor M14 is connected to the sixth node N6, a drain of the fourteenth transistor M14 is connected to the first node N1, and a gate of the fourteenth transistor M14 is connected to the second voltage signal VGH1. A first electrode plate of the fifth capacitor C5 is connected to the drain of the thirteenth transistor M13, and a second electrode plate of the fifth capacitor C5 is connected to the seventh node N7. A source of the fifteenth transistor M15 is connected to the first voltage signal VGL1, a drain of the fifteenth transistor M15 is connected to the third node N3, and a gate of the fifteenth transistor M15 is connected to the second node N2. A source of the sixteenth transistor M16 is connected to the second voltage signal VGH1, a drain of the sixteenth transistor M16 is connected to the third node N3, and a gate of the sixteenth transistor M16 is connected to the first node N1. The first electrode plate of the third capacitor C3 is connected to the first voltage signal VGL1, and the second electrode plate of the third capacitor C3 is connected to the second node N2. The first electrode plate of the fourth capacitor C4 is connected to the second clock signal or the second voltage signal VGH1, and the second electrode plate of the fourth capacitor C4 is connected to the first node N1.

With continued reference to FIGS. 23 to 25, in an embodiment, the first control part 110 further includes the second capacitor C2, where the first electrode plate of the second capacitor C2 is connected to the third node N3, and the second electrode plate of the second capacitor C2 is connected to the second voltage signal VGH1.

Figure 26:
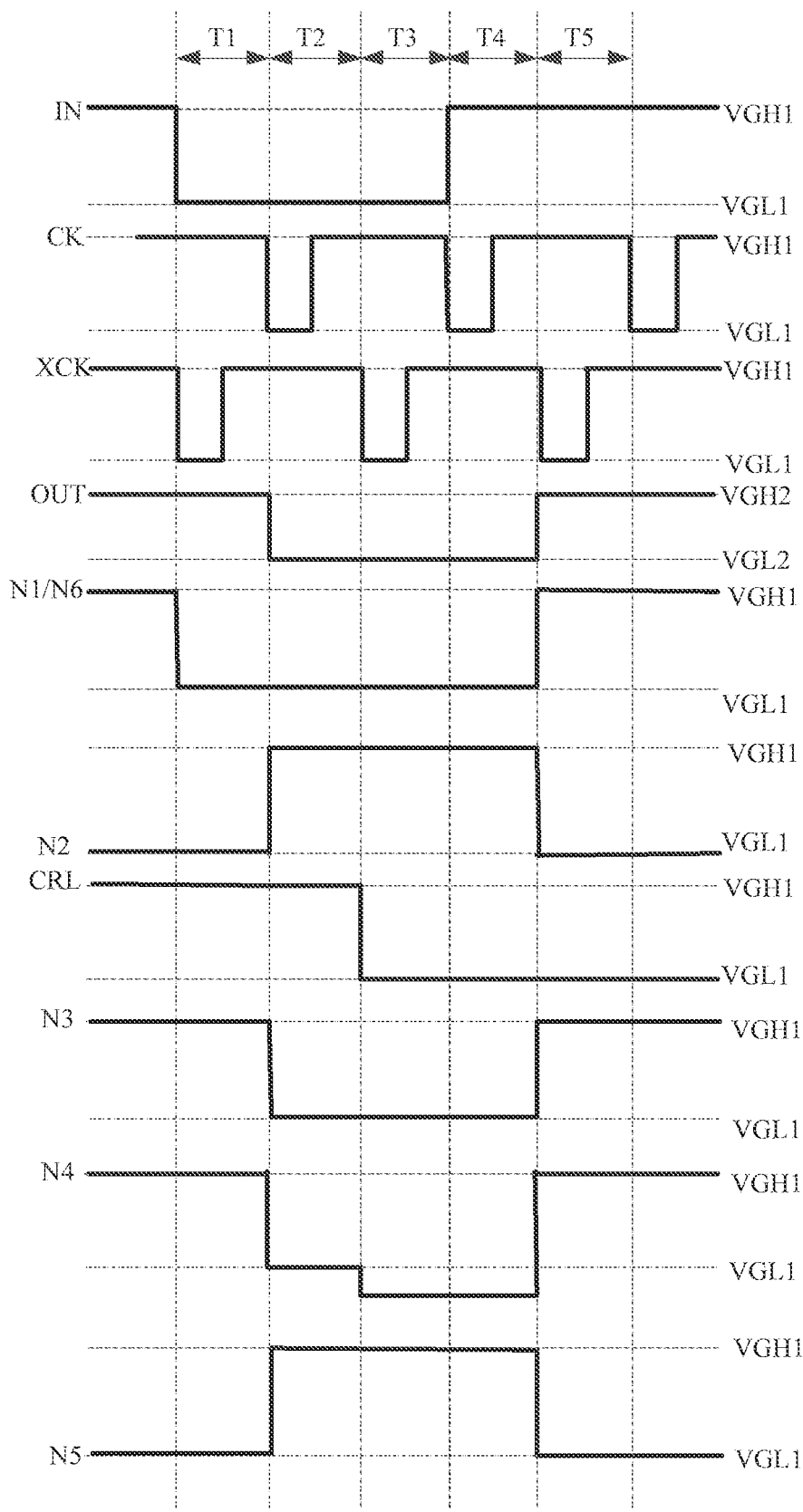
FIG. 26 is a timing sequence diagram of another shift register according to an embodiment of the present disclosure.

For example, FIG. 26 is a timing sequence diagram of another shift register according to an embodiment of the present disclosure. The timing sequence diagram shown in FIG. 26 is applicable to the shift registers shown in FIGS. 22 and 23, where the signal of the third node N3 of the shift register at this stage is used as the input signal IN of the shift register at the next stage, and the signal of the third node N3 of the shift register at the next stage is used as the first output control signal CRL of the shift register at this stage. Referring to FIGS. 22 and 26, the operating process of the shift register shown in FIG. 22 is described below.

In a T1 stage, the input signal IN is at a low level, the first clock signal (the CK signal) is at a high level, the second clock signal (the XCK signal) is at a low level, the fifth transistor M5 is turned off, the ninth transistor M9 is turned off, the sixth node N6 is maintained at a high level, the sixth transistor M6 is turned on, the eighth transistor M8 is turned off, the eighth node N8 is maintained at a low level, the tenth transistor M10 is turned on, and the second clock signal (the XCK signal) is transmitted to the seventh node N7, so that the seventh node N7 is at a low level, the eleventh transistor M11 is turned on, and the signal of the seventh node N7 is transmitted to the second node N2; the second node N2 is at a low level, the fifteenth transistor M15 is turned on, and the second voltage signal VGH1 is transmitted to the third node N3; the third node N3 is at a high level, the first transistor M1 is turned on, the fourth node N4 is at a high level, the third transistor M3 is turned off, and the second node N2 is at a low level; the fifth node N5 is at a low level, the fourth transistor M4 is turned on, and the fourth voltage signal VGH2 is transmitted to the output terminal; and the output signal OUT is at a high level.

In a T2 stage, the input signal IN is at a low level, the first clock signal (the CK signal) is at a low level, the second clock signal (the XCK signal) is at a high level, the fifth transistor M5 is turned on, and the input signal IN is transmitted to the sixth node N6, so that the sixth node N6 is at a low level, the ninth transistor M9 is turned on, and the first voltage signal VGL1 is transmitted to the eighth node N8; the eighth node N8 is at a low level, the tenth transistor M10 is turned on, the seventh node N7 is maintained at a high level, the sixth transistor M6 is turned off, the eleventh transistor M11 is turned off, the sixth node N6 controls the twelfth transistor M12 to be turned on, and the second voltage signal VGH1 is transmitted to the second node N2; the second node N2 is at a high level, the fifteenth transistor M15 is turned off, and the high level of the second node N2 is transmitted to the fifth node N5; the fourth transistor M4 is turned off, the fourteenth transistor M14 is turned on, the signal of the sixth node N6 is transmitted to the first node N1, the first node N1 is at a low level, the first node N1 controls the sixteenth transistor M16 to be turned on, and the first voltage signal VGL1 is transmitted to the third node N3; the third node N3 is at a low level, the first transistor M1 is turned on, the fourth node N4 is at a low level, the third transistor M3 is turned on, and the third voltage signal VGL3 is transmitted to the output terminal; and the output signal OUT is at a low level.

In a T3 stage, the input signal IN is at a low level, the first clock signal (the CK signal) is at a high level, the second clock signal (the XCK signal) is at a low level, the fifth transistor M5 is turned off, the ninth transistor M9 is turned off, the sixth node N6 is maintained at a low level, the sixth transistor M6 is turned on, the eighth transistor M8 is turned on, and the high level of the first clock signal (the CK signal) is written into the eighth node N8, so that the eighth node N8 is at a high level, the tenth transistor M10 is turned off, the seventh node N7 is maintained at a high level, the eleventh transistor M11 is turned on, and the signal of the seventh node N7 is transmitted to the second node N2; the second node N2 is at a high level, the fifteenth transistor M15 is turned off, and the high level of the second node N2 is transmitted to the fifth node N5; the fourth transistor M4 is turned off, the fourteenth transistor M14 is turned on, the signal of the sixth node N6 is transmitted to the first node N1, the first node N1 is at a low level, the first node N1 controls the sixteenth transistor M16 to be turned on, and the first voltage signal VGL1 is transmitted to the third node N3; and the third node N3 is at a low level. Since the first output control signal CRL and the signal of the preset node (the third node N3) are both at low levels, the first transistor M1 is turned off, the fourth node N4 becomes a low level with a lower voltage value under the action of the first output control signal CRL, the third transistor M3 is kept on, and the third voltage signal VGL3 is transmitted to the output terminal, so that the output signal OUT is at a low level.

In a T4 stage, the input signal IN is at a high level, the first clock signal (the CK signal) is at a low level, the second clock signal (the XCK signal) is at a high level, the fifth transistor M5 is turned on, and the input signal IN is transmitted to the sixth node N6, so that the sixth node N6 is at a high level, the ninth transistor M9 is turned on, and the first voltage signal VGL1 is transmitted to the eighth node N8; the eighth node N8 is at a low level, the tenth transistor M10 is turned on, and the second clock signal (the XCK signal) is transmitted to the seventh node N7; the seventh node N7 is maintained at a high level, the sixth transistor M6 is turned off, the eleventh transistor M11 is turned off, the twelfth transistor M12 is turned off, the second node N2 is maintained at a high level, the fifth node N5 is at a high level, the fourth transistor M4 is turned off, the fourteenth transistor M14 is turned on, the signal of the sixth node N6 is transmitted to the first node N1, the first node N1 is at a low level, the first node N1 controls the sixteenth transistor M16 to be turned on, and the first voltage signal VGL1 is transmitted to the third node N3; the third node N3 is at a low level, the first transistor M1 is turned off, the fourth node N4 is maintained at a low level with a lower voltage value, the third transistor M3 is turned on, and the third voltage signal VGL3 is transmitted to the output terminal; and the output signal OUT is at a low level.

In a T5 stage, the input signal IN is at a high level, the first clock signal (the CK signal) is at a high level, the second clock signal (the XCK signal) is at a low level, the fifth transistor M5 is turned off, the ninth transistor M9 is turned off, the sixth node N6 is maintained at a high level, the sixth transistor M6 is turned on, the eighth transistor M8 is turned off, the eighth node N8 is maintained at a low level, the tenth transistor M10 is turned on, and the second clock signal (the XCK signal) is transmitted to the seventh node N7, so that the seventh node N7 is at a low level, the eleventh transistor M11 is turned on, and the signal of the seventh node N7 is transmitted to the second node N2; the second node N2 is at a low level, the fifteenth transistor M15 is turned on, and the second voltage signal VGH1 is transmitted to the third node N3; the third node N3 is at a high level, the first transistor M1 is turned on, the fourth node N4 is at a high level, the third transistor M3 is turned off, and the second node N2 is at a low level; the fifth node N5 is at a low level, the fourth transistor M4 is turned on, and the fourth voltage signal VGH2 is transmitted to the output terminal; and the output signal OUT is at a high level.

With continued reference to FIG. 26, it is to be noted that the fourth node N4 and the preset node (the third node N3)

are both low level signals in the T2 to T4 stages, and at the junction of the T2 stage and the T3 stage, the first output control signal CRL transits from a high level signal to a low level signal, and the fourth node N4 transits from a low level signal to a low level signal with a lower voltage value through the coupling effect of the first capacitor C1, so that the third transistor M3 can be turned on more fully, and thus tailing can be avoided. It is also to be noted that in the T3 to T4 stages, when the signal of the preset node (the third node N3) and the first output control signal CRL are both low level signals, the fifth voltage signal VGL3 controls the first transistor M1 to be turned off. In this manner, the signal change of the fourth node N4 can be prevented from returning to the preset node, to prevent the signal change of the fourth node N4 from causing the signal change of the preset node. The signal of the third node N3 is the input of the shift register at the next stage. In this manner, the output of the shift register at the next stage can be prevented from being affected.

With continued reference to FIGS. 23 and 26, the operating timing sequence of the shift register shown in FIG. 23 is similar to the operating timing sequence of the shift register shown in FIG. 22. The difference is that in the T2 to T4 stages, the preset node (the third node N3) is a low level signal, the second transistor M2 is turned on, and the first output control signal CRL may act on the fourth node N4 through the first capacitor C1; and in the T1 and T5 stages, the preset node (the third node N3) is a low level signal, the second transistor M2 is turned off, and the first output control signal CRL cannot be transmitted to the first capacitor C1. In this manner, it can be ensured that only when the preset node (the third node N3) is a low level signal, the first output control signal CRL is connected to the shift register at this stage, and the first output control signal CRL is not allowed to affect the potential of the fourth node N4 at other times. In this manner, it can be ensured that the circuit is more stable when the preset node (the third node N3) is a high level signal.

Figure 27:
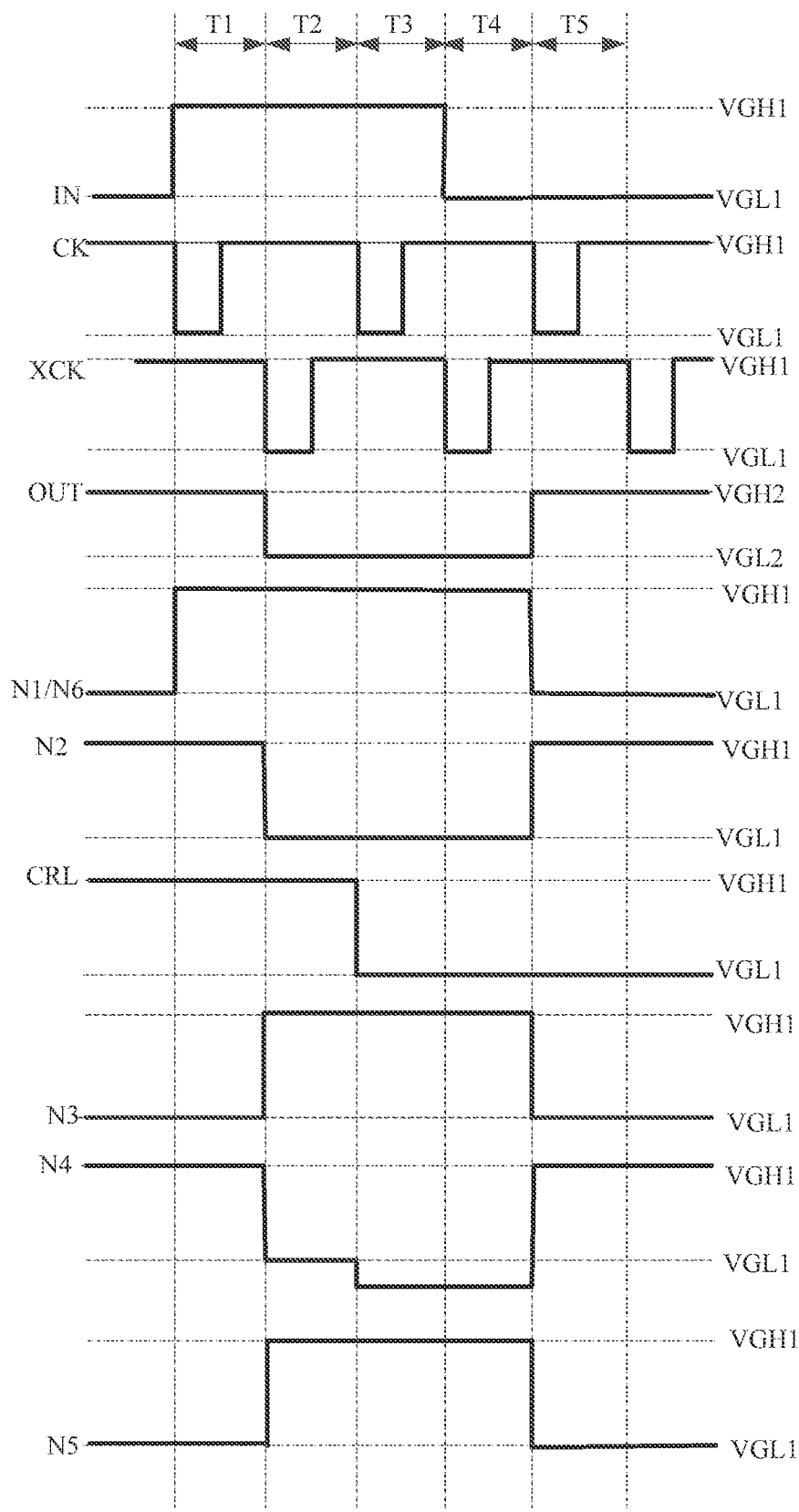
FIG. 27 is a timing sequence diagram of another shift register according to an embodiment of the present disclosure.

For example, FIG. 27 is a timing sequence diagram of another shift register according to an embodiment of the present disclosure. The timing sequence diagram shown in FIG. 27 is applicable to the shift registers shown in FIGS. 24 and 25, where the signal of the third node N3 of the shift register at this stage is used as the input signal IN of the shift register at the next stage, and the signal of the second node N2 of the shift register at the next stage is used as the first output control signal CRL of the shift register at this stage. Referring to FIGS. 24 and 27, the operating process of the shift register shown in FIG. 24 is described below.

In a T1 stage, the input signal IN is at a high level, the first clock signal (the CK signal) is at a low level, the second clock signal (the XCK signal) is at a high level, the fifth transistor M5 is turned on, and the input signal IN is transmitted to the sixth node N6, so that the sixth node N6 is at a high level, the ninth transistor M9 is turned on, and the first voltage signal VGL1 is transmitted to the eighth node N8; the eighth node N8 is at a low level, the tenth transistor M10 is turned on, the second clock signal (the XCK signal) is transmitted to the seventh node N7, the seventh node N7 is maintained at a high level, the sixth transistor M6 is turned off, the eleventh transistor M11 is turned off, the twelfth transistor M12 is turned off, the second node N2 is maintained at a high level, the fifteenth transistor M15 is turned off, the first transistor M1 is turned on, the high level of the second node N2 is transmitted to the fourth node N4, the third transistor M3 is turned off, the first node N1 is maintained at a high level, the sixteenth transistor M16 is turned off, the third node N3 is maintained at a low level, the fifth node N5 is maintained at a low level, the fourth transistor M4 is turned on, and the fourth voltage signal VGH2 is transmitted to the output terminal; and the output signal OUT is at a high level.

In a T2 stage, the input signal IN is at a high level, the first clock signal (the CK signal) is at a high level, the second clock signal (the XCK signal) is at a low level, the fifth transistor M5 is turned off, the ninth transistor M9 is turned off, the sixth node N6 is maintained at a high level, the sixth transistor M6 is turned on, the eighth transistor M8 is turned off, the eighth node N8 is maintained at a low level, the tenth transistor M10 is turned on, and the second clock signal (the XCK signal) is transmitted to the seventh node N7, so that the seventh node N7 is at a low level, the eleventh transistor M11 is turned on, and the signal of the seventh node N7 is transmitted to the second node N2; the second node N2 is at a low level, the fifteenth transistor M15 is turned on, and the second voltage signal VGH1 is transmitted to the third node N3; the third node N3 is at a high level, the fifth node N5 is at a high level, the fourth transistor M4 is turned off, and the low level of the second node N2 turns on the first transistor M1; the fourth node N4 is at a low level, the third transistor M3 is turned on, and the third voltage signal VGL2 is transmitted to the output terminal; and the output signal OUT is at a low level.

In a T3 stage, the input signal IN is at a high level, the first clock signal (the CK signal) is at a low level, the second clock signal (the XCK signal) is at a high level, the fifth transistor M5 is turned on, and the input signal IN is transmitted to the sixth node N6, so that the sixth node N6 is at a high level, the ninth transistor M9 is turned on, and the first voltage signal VGL1 is transmitted to the eighth node N8; the eighth node N8 is at a low level, the tenth transistor M10 is turned on, the second clock signal (the XCK signal) is transmitted to the seventh node N7, the seventh node N7 is maintained at a high level, the sixth transistor M6 is turned off, the eleventh transistor M11 is turned off, the twelfth transistor M12 is turned off, the fifteenth transistor M15 is turned off, the first node N1 is maintained at a high level, the sixteenth transistor M16 is turned off, the third node N3 is maintained at a high level, the fifth node N5 is maintained at a high level, the fourth transistor M4 is turned off, and the second node N2 is maintained at a low level. Since the first output control signal CRL and the signal of the preset node (the second node N2) are both low level signals, the first transistor M1 is turned off, the fourth node N4 becomes a low level with a lower voltage value under the action of the first output control signal CRL, the third transistor M3 is kept on, and the third voltage signal VGL2 is transmitted to the output terminal; and the output signal OUT is at a low level.

In a T4 stage, the input signal IN is at a high level, the first clock signal (the CK signal) is at a high level, the second clock signal (the XCK signal) is at a low level, the fifth transistor M5 is turned off, the ninth transistor M9 is turned off, the sixth node N6 is maintained at a high level, the sixth transistor M6 is turned on, the eighth transistor M8 is turned off, the eighth node N8 is maintained at a low level, the tenth transistor M10 is turned on, and the second clock signal (the XCK signal) is transmitted to the seventh node N7, so that the seventh node N7 is at a low level, the eleventh transistor M11 is turned on, and the signal of the seventh node N7 is transmitted to the second node N2; the second node N2 is at a low level, the fifteenth transistor M15 is turned on, and the second voltage signal VGH1 is transmitted to the third node N3; the third node N3 is at a high level, the fifth node N5 is at a high level, the fourth transistor M4 is turned off, the first transistor M1 is turned off, the fourth node N4 is maintained at a low level with a lower voltage value, the third transistor M3 is turned on, and the third voltage signal VGL2 is transmitted to the output terminal; and the output signal OUT is at a low level.

In a T5 stage, the input signal IN is at a low level, the first clock signal (the CK signal) is at a low level, the second clock signal (the XCK signal) is at a high level, the fifth transistor M5 is turned on, and the input signal IN is transmitted to the sixth node N6, so that the sixth node N6 is at a low level, the ninth transistor M9 is turned on, and the first voltage signal VGL1 is transmitted to the eighth node N8; the eighth node N8 is at a low level, the tenth transistor M10 is turned on, and the second clock signal (the XCK signal) is transmitted to the seventh node N7; the seventh node N7 is maintained at a high level, the sixth transistor M6 is turned off, the eleventh transistor M11 is turned off, the sixth node N6 controls the twelfth transistor M12 to be turned on, and the second voltage signal VGH1 is transmitted to the second node N2; the second node N2 is at a high level, the fifteenth transistor M15 is turned off, the first transistor M1 is turned on, and the high level of the second node N2 is transmitted to the fourth node N4; the third transistor M3 is turned off, the fourteenth transistor M14 is turned on, the signal of the sixth node N6 is transmitted to the first node N1, the first node N1 is at a low level, the first node N1 controls the sixteenth transistor M16 to be turned on, and the first voltage signal VGL1 is transmitted to the third node N3; the third node N3 is at a low level, the fifth node N5 is at a low level, the fourth transistor M4 is turned on, and the fourth voltage signal VGH2 is transmitted to the output terminal; and the output signal OUT is at a high level.

With continued reference to FIG. 27, it is to be noted that the fourth node N4 and the preset node (the second node N2) are both low level signals in the T2 to T4 stages, and at the junction of the T2 stage and the T3 stage, the first output control signal CRL transits from a high level signal to a low level signal, and the fourth node N4 transits from a low level signal to a low level signal with a lower voltage value through the coupling effect of the first capacitor C1, so that the third transistor M3 can be turned on more fully, and thus tailing can be avoided. It is also to be noted that in the T3 to T4 stages, when the signal of the preset node (the second node N2) and the first output control signal CRL are both low level signals, the fifth voltage signal VGL3 controls the first transistor M1 to be turned off. In this manner, the signal change of the fourth node N4 can be prevented from returning to the preset node, to prevent the signal change of the fourth node N4 from causing the signal change of the preset node. The signal of the third node N3 is the input of the shift register at the next stage. In this manner, the output of the shift register at the next stage can be prevented from being affected.

With continued reference to FIGS. 23 and 26, the operating timing sequence of the shift register shown in FIG. 23 is similar to the operating timing sequence of the shift register shown in FIG. 22. The difference is that in the T2 to T4 stages, the preset node (the second node N2) is a low level signal, the second transistor M2 is turned on, and the first output control signal CRL may act on the fourth node N4 through the first capacitor C1; and in the T1 and T5 stages, the preset node (the second node N2) is a low level signal, the second transistor M2 is turned off, and the first output control signal CRL cannot be transmitted to the first capacitor C1. In this manner, it can be ensured that only when the preset node (the second node N2) is a low level signal, the first output control signal CRL is connected to the shift register at this stage, and the first output control signal CRL is not allowed to affect the potential of the fourth node N4 at other times. In this manner, it can be ensured that the circuit is more stable when the preset node (the second node N2) is a high level signal.

It is to be noted that, in the preceding implementations, the first clock signal in the shift register at the M1-th stage is the CK signal, and the second clock signal is the XCK signal; the first clock signal in the shift register at the (M1+1)-th stage is the XCK signal, and the second clock signal is the CK signal; and the first clock signal and the second clock signal in other shift register are set in such alternant manner. As shown in FIG. 26, in the case of |M1−M2|=1, that is, M2 is the next stage or the previous stage of M1. Herein, the case where M2 is the next stage of M1 is used as an example. After the IN signal in the shift register at the M1-th stage becomes a low level, when the first clock signal (the CK signal) becomes a low level pulse, the output signal OUT becomes a low level signal; and thereafter, when the first clock signal (the XCK signal) in the shift register at the M2-th stage becomes a low level signal, the output signal OUT of the shift register at the M2-th stage becomes a low level signal. In this case, the signal of the preset node of the shift register at the M2-th stage also becomes a low level signal, may be used as the first output control signal CRL of the shift register at the M1-th stage, and is used to pull down the potential of the fourth node N4.

In addition, it is to be noted that, as described above, since the effective pulse time of the CK signal and the effective pulse time of the XCK signal do not overlap, and to fully simplify the process, the waveform of the CK signal is often the same as the waveform of the XCK signal, and the difference only exists in the timing. In this case, when each of the CK signal and the XCK signal transits once, the output signal of the shift register is shifted twice toward the next stage and the stage next to the next stage. In conjunction with the preceding analysis, when the pulse period of the first clock signal (the CK signal or the XCK signal) is S1, the width of the low level pulse of the output signal OUT is S2, where S2=a×S1. Since when the first clock signal passes through one pulse period, each of the CK signal and the XCK signal transits once, then in the case of i≤2a, during at least part of the time period where the shift register at the M1-th stage outputs a low level output signal OUT, the signal of the preset node of the shift register at the M2-th stage may be a low level signal and may be used as the first output control signal received by the shift register at the M1-th stage, so that the potential of the fourth node N4 can be pulled down, and the stable output of the low level output signal OUT can be ensured.

In an embodiment, in the N stages of shift registers of the driver circuit 10, the output signal of the shift register at the M3-th stage is not used as the drive signal of the display region AA of the display panel, and the output signal of the shift register at the remaining at least one stage is used as the drive signal of the display region AA of the display panel, where 1≤M3≤N.

In an embodiment, the output signal of the shift register at the M3-th stage is not used as a drive signal of the display region AA, and the shift register at the M3-th stage is a virtual shift register. In the driver circuit 10, the first output control signal CRL of the shift register at one stage is the signal of the preset node NY of the shift register at another stage. Therefore, the shift register that is used as a virtual shift register needs to be provided in the driver circuit 10. The function of the virtual shift register is to provide the first output control signal CRL for the shift registers at other stages, and the first output control signal CRL is not used as a drive signal of the display region AA of the display panel. For example, in one embodiment, the first output control signal CRL of the shift register at the previous stage is the signal of the preset node NY of the shift register at the next stage, and then a shift register at one stage needs to be used as a virtual shift register to serve as the shift register at the previous stage to provide the first output control signal CRL. In this case, M3 may be equal to N, that is, the shift register at the last stage is used as the virtual shift register.

Based on the preceding inventive concept, embodiments of the present disclosure further provide a display device. The display device includes the display panel described in any embodiment of the present disclosure. Therefore, the display device provided in embodiments of the present disclosure also has the beneficial effects described in the preceding embodiments, which will not be repeated herein.

Figure 28:
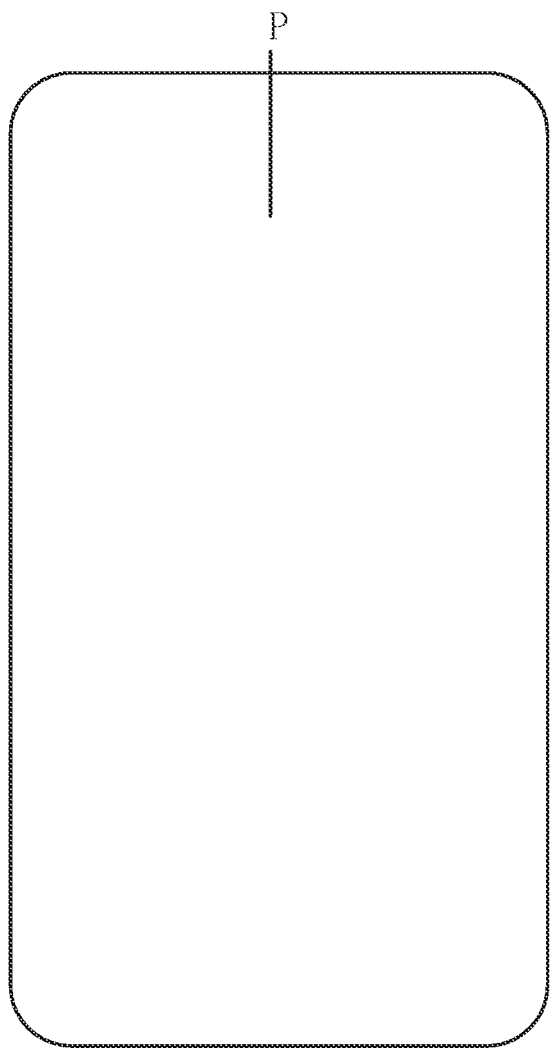
FIG. 28 is a structure diagram of a display device according to an embodiment of the present disclosure.

For example, FIG. 28 is a structure diagram of a display device according to an embodiment of the present disclosure. Referring to FIG. 28, the display device includes the display panel P provided in the preceding embodiments. For example, the display device may include a mobile phone, a computer, a smart wearable device and the like, which is not limited in embodiments of the present disclosure.

What is claimed is:

1. A display panel, comprising:
a driver circuit comprising N stages of cascaded shift registers, wherein N≥2, and each of the N stages of cascaded shift registers comprises: a first control part and a second control part;
wherein the first control part is configured to receive at least an input signal and controls a signal of a first node and a signal of a second node in response to at least a first clock signal, and the first control part is configured to receive a first voltage signal and a second voltage signal and controls a signal of a third node in response to a signal of the first node and a signal of the second node, wherein the first voltage signal is a low level signal, and the second voltage signal is a high level signal; and the second control part comprises a first control unit and a second control unit;
the first control unit is configured to receive a signal of a preset node and a first output control signal and control a signal of a fourth node, wherein the preset node is one of the second node or the third node; and
the second control unit is configured to receive a third voltage signal and generate an output signal in response to a signal of the fourth node, or the second control unit is configured to receive a fourth voltage signal and generate an output signal in response to a signal of a fifth node, wherein the fifth node, the second node and the third node are three independent nodes, the fifth node is directly electrically connected to one of the second node or the third node that is not the preset node, the third voltage signal is a low level signal, and the fourth voltage signal is a high level signal;
a first output control signal received by a shift register at an M1-th stage is a signal of the preset node of a shift register at an M2-th stage, wherein 1≤M1≤N, 1≤M2≤N, 1≤|M1−M2|≤i, and 2≤i≤N−1.

2. The display panel of claim 1, wherein during at least part of a time period during which a signal of the fourth node is a low level signal, each of a signal of the preset node and the first output control signal is a low level signal.

3. The display panel of claim 1, wherein a pulse period of the first clock signal is S1, and a width of a low level pulse of the output signal is S2, wherein S2=a×S1, and i≤2a.

4. The display panel of claim 1, wherein the first control unit comprises a first capacitor, wherein a first electrode plate of the first capacitor is configured to receive the first output control signal, and a second electrode plate of the first capacitor is connected to the fourth node.

5. The display panel of claim 4, wherein the first control unit further comprises a first gating unit, wherein one terminal of the first gating unit is connected to the preset node, another terminal of the first gating unit is connected to the fourth node, and a control terminal of the first gating unit is configured to receive a fifth voltage signal; and
in a case where each of a signal of the preset node and the first output control signal is a low level signal, the fifth voltage signal is configured to control the first gating unit to be turned off.

6. The display panel of claim 5, wherein the first gating unit comprises a first transistor, wherein a source of the first transistor is connected to the preset node, a drain of the first transistor is connected to the fourth node, and a gate of the first transistor is configured to receive the fifth voltage signal; and
in a case where each of a signal of the preset node and the first output control signal is a low level signal, the fifth voltage signal is configured to control the first transistor to be turned off.

7. The display panel of claim 6, wherein the first transistor is a P-type metal oxide semiconductor (PMOS) type transistor, the fifth voltage signal is a constant low level signal V, and |V|≤|VGL1|+|Vth|, wherein VGL1 denotes the first voltage signal, and Vth denotes a threshold voltage of the first transistor.

8. The display panel of claim 6, wherein the fifth voltage signal and the first voltage signal are a same signal.

9. The display panel of claim 4, wherein the first control unit further comprises a second gating unit, wherein one terminal of the second gating unit is connected to the fourth node, another terminal of the second gating unit is configured to receive the first output control signal, and a control terminal of the second gating unit is connected to the preset node; and
in a case where a signal of the preset node is a low level signal, the second gating unit is turned on.

10. The display panel of claim 9, wherein the second gating unit comprises a second transistor, wherein a source of the second transistor is configured to receive the first output control signal, a drain of the second transistor is connected to the fourth node, and a gate of the second transistor is connected to the preset node.

11. The display panel of claim 1, wherein in a case where the preset node is the third node and the input signal of each of the N stages of cascaded shift registers is a low level signal, the output signal is a low level signal.

12. The display panel of claim 1, wherein in a case where the preset node is the second node and the input signal of each of the N stages of cascaded shift registers is a high level signal, the output signal is a low level signal.

13. The display panel of claim 1, wherein in the N stages of cascaded shift registers of the driver circuit, a signal of the third node of the shift register at the M1-th stage is connected to an input signal terminal of a shift register at an (M1+1)-th stage and is used as an input signal of the shift register at the (M1+1)-th stage, wherein 1≤M1≤N.

14. The display panel of claim 1, wherein the second control unit comprises a third transistor and a fourth transistor;
- a source of the third transistor is configured to receive the third voltage signal, a drain of the third transistor is connected to an output signal terminal, and a gate of the third transistor is connected to the fourth node; and
- a source of the fourth transistor is configured to receive the fourth voltage signal, a drain of the fourth transistor is connected to the output signal terminal, and a gate of the fourth transistor is connected to the fifth node.

15. The display panel of claim 1, wherein the first control part comprises a third control unit, a fourth control unit, and a fifth control unit;
- the third control unit is configured to receive the input signal and control a signal of a sixth node in response to the first clock signal, wherein the sixth node is connected to the first node;
- the fourth control unit is configured to receive the second voltage signal and control a signal of the second node in response to at least the input signal and a signal of the sixth node; and
- the fifth control unit is configured to receive the first voltage signal and the second voltage signal and control a signal of the third node in response to a signal of the first node and a signal of the second node.

16. The display panel of claim 1, wherein an effective pulse time of a first clock signal received by the shift register at the M1-th stage and an effective pulse time of a first clock signal received by a shift register at an (M1+1)-th stage do not overlap.

17. The display panel of claim 1, wherein the first control part comprises a third control unit, a fourth control unit, and a fifth control unit;
- the third control unit is configured to receive the input signal and control a signal of a sixth node in response to the first clock signal, wherein the sixth node is connected to the first node;
- the fourth control unit is configured to receive the first voltage signal and the second voltage signal and control a signal of the second node in response to a signal of the sixth node, the first clock signal, and a second clock signal; and
- the fifth control unit is configured to receive the first voltage signal and the second voltage signal and control a signal of the third node in response to a signal of the first node and a signal of the second node.

18. The display panel of claim 1, wherein in the N stages of cascaded shift registers of the driver circuit, an output signal of a shift register at an M3-th stage is not used as a drive signal of a display region of the display panel, and an output signal of a shift register at remaining at least one stage is used as the drive signal of the display region of the display panel, wherein 1≤M3≤N.

19. A display device, comprising a display panel, wherein the display panel comprises: a driver circuit comprising N stages of cascaded shift registers, wherein N≥2, and each of the N stages of cascaded shift registers comprises: a first control part and a second control part;
- wherein the first control part is configured to receive at least an input signal and controls a signal of a first node and a signal of a second node in response to at least a first clock signal, and the first control part is configured to receive a first voltage signal and a second voltage signal and controls a signal of a third node in response to a signal of the first node and a signal of the second node, wherein the first voltage signal is a low level signal, and the second voltage signal is a high level signal; and the second control part comprises a first control unit and a second control unit;
- the first control unit is configured to receive a signal of a preset node and a first output control signal and control a signal of a fourth node, wherein the preset node is one of the second node or the third node; and
- the second control unit is configured to receive a third voltage signal and generate an output signal in response to a signal of the fourth node, or the second control unit is configured to receive a fourth voltage signal and generate an output signal in response to a signal of a fifth node, wherein the fifth node, the second node and the third node are three independent nodes, the fifth node is directly electrically connected to one of the second node or the third node that is not the preset node, the third voltage signal is a low level signal, and the fourth voltage signal is a high level signal;
- a first output control signal received by a shift register at an M1-th stage is a signal of the preset node of a shift register at an M2-th stage, wherein 1≤M1≤N, 1≤M2≤N, 1≤|M1−M2|≤i, and 2≤i≤N−1.

* * * * *